US005581210A

United States Patent [19]

Kimura

[11] Patent Number: 5,581,210

[45] Date of Patent: Dec. 3, 1996

[54] ANALOG MULTIPLIER USING AN OCTOTAIL CELL OR A QUADRITAIL CELL

[75] Inventor: Katsuji Kimura, Tokyo, Japan

[73] Assignee: NEC Corporation, Tokyo, Japan

[21] Appl. No.: 170,902

[22] Filed: Dec. 21, 1993

[30] Foreign Application Priority Data

| | | | |
|---|---|---|---|
| Dec. 21, 1992 | [JP] | Japan | 4-356258 |
| Oct. 12, 1993 | [JP] | Japan | 5-278977 |

[51] Int. Cl.$^{6}$ .......... H03K 5/22

[52] U.S. Cl. .......... 327/355; 327/357; 327/359; 327/105; 327/113; 327/119; 455/333

[58] Field of Search .......... 302/529, 492, 302/494, 497, 271; 328/160, 158, 156, 15, 16; 455/333, 326

[56] References Cited

U.S. PATENT DOCUMENTS

| | | | |
|---|---|---|---|
| 1,780,383 | 11/1930 | Green | 248/180.1 X |
| 2,775,423 | 12/1956 | Strass | 248/180.1 |
| 4,156,283 | 5/1979 | Gilbert | 328/160 |
| 4,546,275 | 10/1985 | Pena-Finol et al. | 327/357 |
| 4,636,663 | 1/1987 | Jongepier et al. | 328/156 |
| 5,107,150 | 4/1992 | Kimura | 307/529 |
| 5,118,945 | 6/1992 | Winschuh et al. | 250/341.6 X |
| 5,313,063 | 5/1994 | Netzer | 250/347 |
| 5,353,534 | 10/1994 | Kimura | 327/113 |

FOREIGN PATENT DOCUMENTS 0234655 9/1987 European Pat. Off. .

OTHER PUBLICATIONS

K. Kimura, "A Unified Analysis of Four–Quadrant Analog Multipliers Consisting of Emitter and . . . on Low Supply Voltage", IEICE Transactions on Electronics, vol. E76–C, No. 5, May 1993, pp. 714–737.

Klaas Bult, "Analog CMOS Suare–Law Circuits".

*Primary Examiner*—Terry Cunningham
*Assistant Examiner*—Dinh T. Le
*Attorney, Agent, or Firm*—Sughrue, Mion, Zinn, Macpeak & Seas

[57] ABSTRACT

A multiplier in which simplification of a circuit configuration and reduction of a current consumption can be realized. There are provided with first, second, third and fourth pairs of transistors whose capacities are the same with each other and these four pairs are driven by a constant current source, respectively. A sum of first and second input voltage is applied in positive phase to an input end of the first pair and the sum is applied in opposite phase to the other input end thereof. A difference of the first and second input voltages is applied in positive phase to an input end of the second pair and the difference is applied in opposite phase to the other input end thereof. Input ends of the third pair and those of the fourth pair are coupled together to be applied with a direct current voltage. The output ends coupled of the first pair and those coupled of the third pair are coupled together to form one of differential output ends, and the output ends coupled of the second pair and those coupled of the fourth pair are coupled together to form the other of the differential output ends.

18 Claims, 10 Drawing Sheets

$$V_{OS} = V_{DCS} - \sqrt{\frac{\left(\frac{W}{L}\right)_1}{\left(\frac{W}{L}\right)_2}}\,(V_1+V_2)$$

$$V_{OS} = \sqrt{\frac{\left(\frac{W}{L}\right)_1}{\left(\frac{W}{L}\right)_2}}\,(V_1+V_2)$$

ANALOG MULTIPLIER USING AN OCTOTAIL CELL OR A QUADRITAIL CELL

BACKGROUND OF THE INVENTION

1. Field of the Invention

The present invention relates a multiplier and more particularly, to a multiplier for analog signals composed of bipolar transistors or Metal-Oxide-Semiconductor (MOS) transistors, which is formed on semiconductor integrated circuits.

2. Description of the Prior Art

The inventor has developed and filed a Japanese patent application about a multiplier as shown in FIG. 1, which is disclosed in Japanese Non-Examined Patent Publication No. 4-34673 and U.S. Pat. No. 5,107,150.

In FIG. 1, an adder 6 is comprised of a first pair of MOS transistors M51 and M52 and a second pair of MOS transistors M53 and M54. The capacities (W/L) of the transistors M51, M52, M53 and M54 are the same. There are provided with two constant current sources whose current values are both $I_0$ for driving the pair of the transistors M51 and M52 and that of the transistors M53 and M54, respectively. Here, the "capacity" of the MOS transistor means that a ratio of its gate width W to its gate length L, or (W/L).

A first input voltage $V_1$ is applied across the input ends or gates of the transistors M51 and M52. A second input voltage $V_2$ is applied across the input ends or gates of the transistors M53 and M54.

A first subtracter 7 has a similar configuration to the adder 6, however, is different therefrom in input voltage. The subtracter 7 is comprised of a first pair of MOS transistors M59 and M60 and a second MOS transistors M61 and M62. The capacities (W/L) of the transistors M61, M62, M63 and M64 are the same. There are provided with two constant current sources whose current values are both $I_0$ for driving the pair of the transistors M59 and M60 and that of the transistors M61 and M62, respectively.

The first input voltage $V_1$ is applied across the input ends or gates of the transistors M59 and M60 with the same polarity as that of the transistors M51 and M52 of the adder 6. The second input voltage $V_2$ is applied across the input ends or gates of the transistors M61 and M62 with the opposite polarity as that of the transistors M53 and M54 of the adder 6.

A first squarer 8 is comprised of a first pair of MOS transistors M55 and M56 and a second pair of MOS transistors M57 and M58. There are provided with two constant current sources whose current values are both $I_{01}$ for driving the pair of the transistors M55 and M56 and that of the transistors M57 and M58, respectively. The transistors M55 and M56 are different in capacity from each other and the transistors M57 and M58 are also different in capacity from each other. When the capacities of the transistors M55, M56, M57 and M58 are defined as (W55/L55), (W56/L56), (W57/L57) and (W58/L58), respectively, (W56/L56)/(W55/L55)=(W58/L58)/(W57/L57)=k is established, where k>1.

In the first squarer 8, the gates of the transistors M55 and M58 are connected to the drains of the transistors M52 and M54 of the adder 6, and the gates of the transistors M56 and M57 are connected to the drains of the transistors M51 and M53 thereof.

A second squarer 9 has a similar configuration to that of the first squarer 8. The second squarer 9 is comprised of a first pair of MOS transistors M63 and M64 and a second pair of MOS transistors M65 and M66. There are provided with two constant current sources whose current values are both $I_{01}$ for driving the pair of the transistors M63 and M64 and that of the transistors M65 and M66, respectively.

The transistors M63 and M64 are different in capacity from each other and the transistors M65 and M66 are also different in capacity from each other. Similar to the first squarer 8, the capacities (W63/L63), (W64/L64), (W65/L65) and (W66/L66) of the respective transistors M63, M64, M65 and M66 has the following relationships as (W64/L64)/(W63/L63)=(W66/L66)/(W65/L65)=k.

In the second squarer 9, the gates of the transistors M63 and M66 are connected to the drains of the transistors M60 and M62 of the first subtracter 7, and the gates of the transistors M64 and M65 are connected to the drains of the transistors M63 and M65 thereof. Further, the gates of the transistors M64 and M65 are connected to the drains of the transistors M59 and M61 of the first subtracter 7, on the one hand, and connected to the drains of the transistors M56 and M58 of the first squarer 8, on the other hand.

The drains of the transistors M55 and M57 of the first squarer 8 and the drains of the transistors M66 and M64 of the second squarer 9 are connected in common to form one of output ends of the multiplier. The drains of the transistors M56 and M58 of the first squarer 8 and the drains of the transistors M65 and M63 of the second squarer 9 are connected in common to form the other of the output ends thereof. These output ends thus formed are respectively connected to the input ends of the second subtracter 10.

Next, the operation principle of the prior-art multiplier as above will be described below.

With the adder 6, since the four MOS transistors M51, M52, M53 and M54 are equal in capacity (W/L) to each other, they have the same transconductance parameters, respectively. Then, the transconductance parameter $\alpha_1$ is expressed as $$\alpha_1=(1/2)\mu_n C_{ox} (W51/L51)$$

using the capacity (W51/L51) of the transistor M51, where $\mu_n$ is the carrier mobility, $C_{ox}$ is the gate oxide capacitance per unit area, so that the drain currents $I_{d1}$, $I_{d2}$, $I_{d3}$ and $I_{d4}$ of the respective transistors M51, M52, M53 and M54 are expressed as the following equations 1-1, 1-2, 1-3 and 1-4, respectively, where $V_{GS1}$, $V_{GS2}$, $V_{GS3}$ and $V_{GS4}$ are the gate-source voltages of the transistors M51, M52, M53 and M54, respectively, and $V_{TH}$ is the threshold voltage of these transistors.

$$I_{d1}=\alpha_1 (V_{GS1}-V_{TH})^2 \quad (1\text{-}1)$$

$$I_{d2}=\alpha_1 (V_{GS2}-V_{TH})^2 \quad (1\text{-}2)$$

$$I_{d3}=\alpha_1 (V_{GS3}-V_{TH})^2 \quad (1\text{-}3)$$

$$I_{d4}=\alpha_1 (V_{GS4}-V_{TH})^2 \quad (1\text{-}4)$$

Besides, $I_{d1}+I_{d2}=I_0$, $I_{d3}+I_{d4}=I_0$, $V_{GS1}-V_{GS2}=V_1$, $V_{GS3}-V_{GS4}=V_2$ are established, and the current differences $(I_{d1}-I_{d2})$ and $(I_{d3}-I_{d4})$ are expressed as the following equations 2 and 3, respectively, so that a differential output current $(I_A-I_B)$ can be expressed as the following equation 4.

$$I_{d1}-I_{d2}=\alpha_1 V_1 \sqrt{[(2I_0/\alpha_1)-V_1^2]} \quad (2)$$

-continued $$I_{d3} - I_{d4} = \alpha_1 V_2 \sqrt{[(2I_0/\alpha_1) - V_2^2]} \quad (3)$$

$$\begin{aligned} I_A - I_B &= (I_{d1} + I_{d3}) - (I_{d2} + I_{d4}) \quad (4) \\ &= (I_{d1} - I_{d2}) + (I_{d3} - I_{d4}) \\ &= \alpha_1 V_1 \sqrt{[(2I_0/\alpha_1) - V_1^2]} + \\ &\quad \alpha_1 V_2 \sqrt{[(2I_0/\alpha_1) - V_2^2]} \end{aligned}$$

The equations 2 and 3 show the transfer characteristics of the differential pair of the MOS transistors. From the equations 2 and 3, it is seen that the current differences ($I_{d1}-I_{d2}$) and ($I_{d3}-I_{d4}$) are in proportion to the input voltages $V_1$ and $V_2$ in small signal applications, respectively. Therefore, as seen from the equation 4, the differential output current ($I_A-I_B$) of the adder 6 has an adding characteristic with good linearity when the input voltages $V_1$ and $V_2$ are small in value.

In order to use the adder 6 as a subtracter, the second input voltage $V_2$ is required to be applied thereto with opposite polarity. Then, in the first subtracter 7, the second input voltage $V_2$ is applied thereto with such polarity.

With the first subtracter 7, the drain currents of the respective transistors M59, M60, M61 and M62 are defined as $I_{d11}$, $I_{d12}$, $I_{d13}$ and $I_{d14}$, respectively, the current differences ($I_{d11}-I_{d12}$, and ($I_{d13}-I_{d14}$) are expressed as the following equations 5 and 6, respectively, and the differential output current ($I_C-I_D$) is expressed as the following equation 7.

$$I_{d11}-I_{d12}=\alpha_1 V_1\sqrt{[(2I_0/\alpha_1)-V_1^2]} \quad (5)$$

$$I_{d13}-I_{d14}=-\alpha_1 V_2\sqrt{[(2I_0/\alpha_1)-V_2^2]} \quad (6)$$

$$I_C-I_D=(I_{d11}-I_{d13})-(I_{d12}-I_{d14})=(I_{d11}-I_{d12})-(I_{d13}-I_{d14})=\alpha_1 V_1\sqrt{[(2I_0/\alpha_1)-V_1^2]}-\alpha_1 V_2\sqrt{[(2I_0/\alpha_1)-V_2^2]} \quad (7)$$

Accordingly, the differential output voltage $V_A$ of the adder 6 and the differential output voltage $V_B$ of the first subtracter 7 are expressed as the following equations 8 and 9, respectively.

$$\begin{aligned} V_A &= R_L(I_A - I_B) \quad (8) \\ &= R_L[\alpha_1 V_1 \sqrt{\{(2I_0/\alpha_1) - V_1^2\}} + \\ &\quad \alpha_1 V_2 \sqrt{\{(2I_0/\alpha_1) - V_2^2\}}\,] \end{aligned}$$

$$\begin{aligned} V_B &= R_L(I_C - I_D) \quad (9) \\ &= R_L[\alpha_1 V_1 \sqrt{\{(2I_0/\alpha_1) - V_1^2\}} - \\ &\quad \alpha_1 V_2 \sqrt{\{(2I_0/\alpha_1) - V_2^2\}}\,] \end{aligned}$$

With the first squarer 8, since the capacity ratios (W56/L56)/(W55/L55) and (W58/L58)/(W57/L57) of the MOS transistors M55 and M56 and the transistors M57 and M58 are both K, the transconductance parameter $\alpha_2$ is expressed as $$\alpha_2=(1/2)\mu_n C_{OX} (W55/L55)$$

using the capacity (W55/L55) of the transistor M55, so that the drain currents $I_{d5}$, $I_{d6}$, $I_{d7}$ and $I_{d8}$ of the respective transistors M55, M56, M57 and M58 are expressed as the following equations 10-1, 10-2, 10-3 and 10-4, respectively, where $V_{GS5}$, $V_{GS6}$, $V_{GS7}$ and $V_{GS8}$ are the gate-source voltages of the transistors M55, M56, M57 and M58, respectively, and $V_{TH}$ is the threshold voltage of these transistors.

$$I_{d5}=\alpha_2 (V_{GS5}-V_{TH})^2 \quad (10\text{-}1)$$

$$I_{d6}=k\, \alpha_2 (V_{GS6}-V_{TH})^2 \quad (10\text{-}2)$$

$$I_{d7}=\alpha_2 (V_{GS7}-V_{TH})^2 \quad (10\text{-}3)$$

$$I_{d8}=k\, \alpha_2 (V_{GS8}-V_{TH})^2 \quad (10\text{-}4)$$

Besides, $I_{d5}+I_{d6}=I_{01}$, $I_{d7}+I_{d8}=I_{01}$, $V_{GS5}-V_{GS6}=V_{GS8}-V_{GS7}=V_A$ are established, and the current differences ($I_{d5}-I_{d6}$) and ($I_{d7}-I_{d8}$) are expressed as the following equations 11 and 12, respectively.

$$I_{d5} - I_{d6} = \frac{-\left(1-\frac{1}{k}\right)\left\{\left(1+\frac{1}{k}\right)I_{01} - 2\alpha_2 V_A^2\right\}}{\left(1+\frac{1}{k}\right)^2} + \frac{4\alpha_2 V_A \frac{1}{\sqrt{k}}\sqrt{\left(1+\frac{1}{k}\right)\frac{I_{01}}{\alpha_2} - V_A^2}}{\left(1+\frac{1}{k}\right)^2} \quad (11)$$

$$I_{d7} - I_{d8} = \frac{-\left(1-\frac{1}{k}\right)\left\{\left(1+\frac{1}{k}\right)I_{01} - 2\alpha_2 V_A^2\right\}}{\left(1+\frac{1}{k}\right)^2} - \frac{4\alpha_2 V_A \frac{1}{\sqrt{k}}\sqrt{\left(1+\frac{1}{k}\right)\frac{I_{01}}{\alpha_2} - V_A^2}}{\left(1+\frac{1}{k}\right)^2} \quad (12)$$

Then, the differential output current ($I_E-I_F$) can be expressed as the following equation 13. From the equation 13, it is seen that the differential output current ($I_E-I_F$) is in proportion to the square of the input voltage $V_A$.

$$\begin{aligned} I_E - I_F &= (I_{d5} + I_{d7}) - (I_{d6} + I_{d8}) \quad (13) \\ &= (I_{d5} - I_{d6}) + (I_{d7} - I_{d8}) \\ &= -\frac{2\left(1-\frac{1}{k}\right)\left\{\left(1+\frac{1}{k}\right)I_{01} - 2\alpha_2 V_A^2\right\}}{\left(1+\frac{1}{k}\right)^2} \end{aligned}$$

With the second squarer 9, the differential output current ($I_G-I_H$) can be expressed as the following equation 14, in the same way, where $I_{d15}$, $I_{d16}$, $I_{d17}$ and $I_{d18}$ are the drain currents of the respective transistors M63, M64, M65 and M66. From the equation 14, it is seen that the differential output current ($I_G-I_H$) is in proportion to the square of its input voltage $V_B$.

$$\begin{aligned} I_G - I_H &= (I_{d15} + I_{d17}) - (I_{d16} + I_{d18}) \quad (14) \\ &= (I_{d15} - I_{d16}) + (I_{d17} - I_{d18}) \\ &= -\frac{2\left(1-\frac{1}{k}\right)\left\{\left(1+\frac{1}{k}\right)I_{01} - 2\alpha_2 V_B^2\right\}}{\left(1+\frac{1}{k}\right)^2} \end{aligned}$$

In the second subtracter 10, the differential output currents $I_1$ (=$I_E-I_F$) and $I_2$ (=$I_G-I_H$) of the first and second squarers 9 and 10 are added with their polarity being opposite, so that the differential current ($I_1-I_2$) is expressed as the following equation 15.

$$I_1-I_2=(I_E-I_F)-(I_G-I_H) \tag{15}$$

$$=-\frac{2\left(1-\frac{1}{k}\right)\left\{\left(1+\frac{1}{k}\right)I_{01}-2\alpha_2V_A{}^2\right\}}{\left(1+\frac{1}{k}\right)^2}+\frac{2\left(1-\frac{1}{K}\right)\left\{\left(1+\frac{1}{K}\right)I_{01}-2\times\alpha_2V_B{}^2\right\}}{\left(1+\frac{1}{K}\right)^2}$$

$$=\frac{4\alpha_2\left(1-\frac{1}{K}\right)}{\left(1+\frac{1}{K}\right)^2}(V_A{}^2-V_B{}^2)$$

By substituting the equations 8 and 9 into the equation 15 to replace $V_A$ and $V_B$, the following equation 16 can be obtained.

$$I_1-I_2=16R_L{}^2\alpha_1{}^2\alpha_2V_1V_2\frac{\left(1-\frac{1}{k}\right)}{\left(1+\frac{1}{k}\right)^2}\times\sqrt{\frac{4I_0{}^2}{\alpha_1{}^2}-\frac{2I_0}{\alpha_1}(V_1{}^2+V_2{}^2)+V_1{}^2V_2} \tag{16}$$

Then by ignoring the terms of $V_1^2$ and $V_2^2$ in the equation 16 the following equation 17 can be given. From the equation 17, it is seen that the circuit shown in FIG. 2 has a multiplying function.

$$I_1-I_2=\frac{32R_L{}^2I_0\alpha_2V_1V_2\alpha_1\left(1-\frac{1}{k}\right)}{\left(1+\frac{1}{k}\right)^2} \tag{17}$$

FIG. 2 shows a result of computer simulation, which was carried out under the condition that $R_L$=5 kΩ, $I_0$=100 μA, $I_{01}$=10 μA, W51=20 μm, L51=5 μm, W55=10 μm, L55=5 μm, K=5, $C_{OX}$=320 Å.

In Fig, 2, the relationships between the differential output current and the first input voltage $V_1$ is shown with the second input voltage $V_2$ as a parameter, however, the same result is obtained by replacing the first input voltage $V_1$ with the second input voltage $V_2$, and vice versa.

The prior-art multiplier shown in FIG. 1 is comprised of MOS transistors, however, the same multiplying operation can be obtained by using bipolar transistors in place of the MOS transistors. In the case, each squarer is composed of a differential pair of transistors whose emitter area are different from each other.

It is well known that there is the minimum unit (area) of a transistor formed on semiconductor integrated circuits in order to generate desired functions, so that it is preferable to form all transistors as the minimum unit considering its current consumption. However, with the prior art multiplier shown in FIG. 1, since each differential pair of the first and second squarers is comprised of two MOS transistors whose capacities or (W/L) are different each other, all the transistors cannot be formed as the minimum unit, and as a result, there arises a problem that circuit currents of the integrated circuits are made large.

In addition, with the prior art multiplier, each differential pair is provided with a constant current source, so that four constant current sources are required in total for the first and second squarers. As a result, there arises another problem that the configuration of the integrated circuits is complex.

SUMMARY OF THE INVENTION

An object of the present invention is to provide a multiplier in which its circuit configuration can be simplified.

Another object of the present invention is to provide a multiplier in which its current consumption can be reduced.

A multiplier according to a first aspect of the present invention comprises a first pair of first and second transistors whose output ends are coupled together, a second pair of third and fourth transistors whose output ends are coupled together, a third pair of fifth and sixth transistors whose output ends are coupled together, and a fourth pair of seventh and eighth transistors whose output ends are coupled together.

The capacities of the two transistors of the respective pairs are the same with each other. The first, second, third and fourth pairs are driven by a constant current source, respectively.

A sum of first and second input voltages is applied in positive phase to an input end of the first transistor, and the sum of the first and second input voltages is applied in opposite phase to an input end of the second transistor.

A difference of the first and second input voltages is applied in positive phase to an input end of the third transistor, and the difference of the first and second input voltages is applied in opposite phase to an input end of the fourth transistor.

Input ends of the fifth and sixth transistors and input ends of the seventh and eighth transistors are coupled together to be applied with a direct current voltage.

The output ends coupled of the first pair and the output ends coupled of the third pair are coupled together to form one of a pair of differential output ends, and the output ends coupled of the second pair and the output ends coupled of the fourth pair are coupled together to form the other of the pair of differential output ends.

Preferably, the direct current voltage is a middle point one of the sum and difference of the first and second input voltages.

A multiplier according to a second aspect of the present invention has a similar configuration to that of the first aspect other than that output ends coupled of the third pair and output ends coupled of the fourth pair are separated from a pair of differential output ends the multiplier, respectively.

Preferably, the output ends coupled of the third pair and the output ends coupled of the fourth pair are coupled together to be applied with a direct current voltage.

With the multipliers of the first and second aspects of the present invention, they are mainly composed of the first to fourth pairs of the transistors whose capacities are the same, respectively. Therefore, all of the transistors forming each multiplier can be made as the minimum units and as a result, its current consumption can be reduced.

In addition, the first to fourth pairs are driven by one constant current source, so that the number of current sources required is reduced by half compared with the prior art multiplier. As a result, the circuit configuration can be simplified.

A multiplier according to a third aspect of the present invention comprises a first pair of first and second transistors whose capacities are the same and whose output ends are coupled together, and a second pair of third and fourth transistors whose capacities are the same and whose output ends are coupled together. The first and second pairs are driven by a constant current source.

A sum of first and second input voltages is applied in positive phase to an input end of the first transistor and the sum of the first and second input voltages is applied in opposite phase to an input end of the second transistor.

A difference of the first and second input voltages is applied in positive phase to an input end of the third transistor and the difference of the first and second input voltages is applied in opposite phase to an input end of the fourth transistor.

Input ends of the first and second transistors and input ends of the third and fourth transistors are coupled together to be applied with a direct current voltage.

The output ends coupled of the first pair forms one of a pair of differential output ends and the output ends coupled of the second pair forms the other of the pair of differential output ends.

Preferably, the direct current voltage is a middle point one of the sum and difference of the first and second input voltages.

With the multiplier of the third aspect of the present invention, it is mainly composed of the first and second pairs of the transistors whose capacities are the same, respectively. Therefore, similar to the first and second aspects, all of the transistors forming the multiplier can be made as the minimum units, resulting in reduced current consumption.

The multiplier of the third aspect employs only two transistor-pairs, so that there is an additional advantage that the current consumption can be smaller than those of the first and second aspects.

In addition, the first and second pairs are driven by one constant current source, so that the number of current sources required is reduced by quarter compared with the prior art multiplier. As a result, the circuit configuration can be simplified, which is simpler than those of the first and second aspects.

DETAILED DESCRIPTION OF THE PREFERRED EMBODIMENTS

Preferred embodiments of the present invention will be described below referring to FIGS. 3 to 14.

As described above, in the prior-art multiplier shown in FIG. 1 which was developed by the inventor, each of the first and second squarers is comprised of two pairs of the MOS transistors whose capacities or (W/L) ratios are different from each other, and is required for two constant current sources. Accordingly, the inventor has developed multipliers comprised of eight or four transistors whose capacities are the same and a single constant current source for driving these transistors. These transistors may be MOS or bipolar ones.

[First Embodiment]

Figure 3:
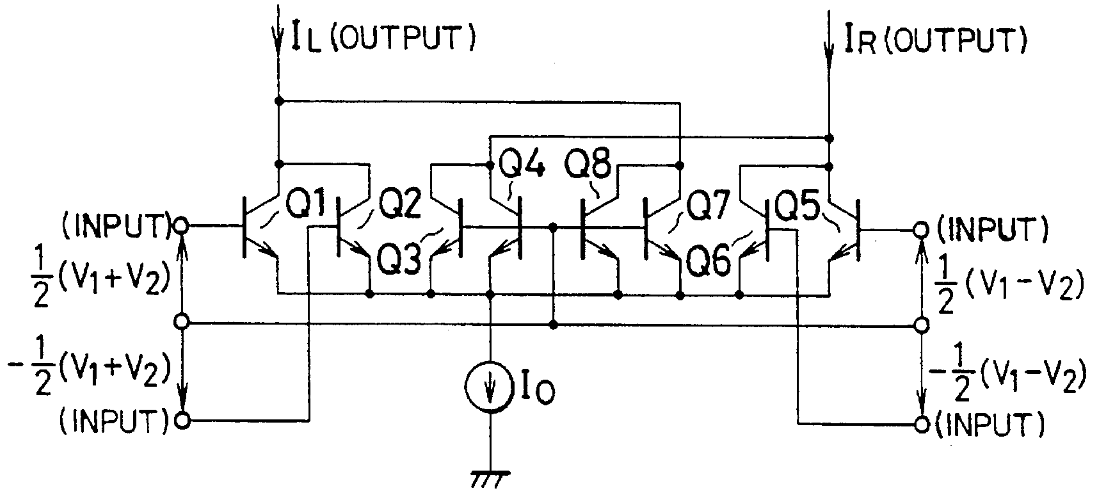
FIG. 3 is a circuit diagram of a multiplier using bipolar transistors according to a first embodiment of the present invention.

In FIG. 3, a multiplier according to a first embodiment is composed of eight bipolar transistors Q1, Q2, Q3, Q4, Q5, Q6, Q7 and Q8 having the same capacities or emitter areas with each other, all of which are driven by a constant current source (current: $I_0$).

A first pair is formed of the transistors Q1 and Q2 whose output ends or collectors are coupled together. A second pair is formed of the transistors Q5 and Q6 whose output ends or collectors are coupled together. A third pair is formed of the transistors Q7 and Q8 whose output ends or collectors are coupled together. A fourth pair is formed of the transistors Q3 and Q4 whose output ends or collectors are coupled together.

Emitters of the transistors Q1, Q2, Q3, Q4, Q5, Q6, Q7 and Q8 are connected in common to the constant current source.

The collectors coupled of the transistors Q1 and Q2 of the first pair and the collectors coupled of the transistors Q7 and Q8 of the third pair are coupled together to form one of a pair of differential output ends of the multiplier. The collectors coupled of the transistors Q5 and Q6 of the second pair and the collectors coupled of the transistors Q3 and Q4 of the fourth pair are coupled together to form the other of the pair of differential output ends.

Input ends or bases of the transistors Q7 and Q8 of the third pair are coupled together and input ends or bases of the transistors Q3 and Q4 of the fourth pair are coupled together. These bases of the transistors Q7, Q8, Q3 and Q4 are further coupled together.

A half sum of first and second input voltages $V_1$ and $V_2$ to be multiplied is applied in positive phase to an input end or a base of the transistor Q1 of the first pair with the bases of the Q7, Q8, Q3 and Q4 as a standard or reference point. The half sum of the first and second input voltages $V_1$ and $V_2$ is applied in opposite phase to an input end or a base of the transistor Q2 thereof with the bases of the Q7, Q8, Q3 and Q4 as the standard point. Thus, a voltage $+(½)(V_1+V_2)$ is applied to the base of the transistor Q1 and a voltage $-(½)(V_1+V_2)$ is applied to the base of the transistor Q2.

A half difference of the first and second input voltages $V_1$ and $V_2$ is applied in positive phase to an input end or a base of the transistor Q5 of the second pair with the bases of the Q7, Q8, Q3 and Q4 as the standard point. The half difference of the first and second input voltages $V_1$ and $V_2$ is applied in opposite phase to an input end or a base of the transistor Q6 thereof with the bases of the Q7, Q8, Q3 and Q4 as the standard point. Thus, a voltage $+(½)(V_1-V_2)$ is applied to the base of the transistor Q5 and a voltage $-(½)(V_1-V_2)$ is applied to the base of the transistor Q6.

Thus, the bases coupled together of the transistors Q3, Q4, Q7 and Q8 are applied with a direct current bias voltage.

Here, the circuit having the eight transistors driven by one constant current source thus above-described is called as a "octotail cell".

With the multiplier shown in FIG. 3, collector currents $I_{C1}$, $I_{C2}$, $I_{C3}$, $I_{C4}$, $I_{C5}$, $I_{C6}$, $I_{C7}$ and $I_{C8}$ of the respective transistors Q1, Q2, Q3, Q4, Q5, Q6, Q7 and Q8 can be expressed as the following equations (18-1), (18-2), (18-3), (18-4) and (18-5), respectively.

$$I_{C1}=I_S\exp[\{V_{BE3}+(½)(V_1+V_2)\}/V_T] \tag{18-1}$$

$$I_{C2}=I_S\exp[\{V_{BE3}-(½)(V_1+V_2)\}/V_T] \tag{18-2}$$

$$I_{C3}=I_{C4}=I_{C7}=I_{C8}=I_S\exp(V_{BE3}/V_T) \tag{18-3}$$

$$I_{C5}=I_S\exp[\{V_{BE3}+(½)(V_1-V_2)\}/V_T] \tag{18-4}$$

$$I_{C6}=I_S\exp[\{V_{VB3}-(½)(V_1-V_2)\}/V_T] \tag{18-5}$$

where $I_S$ is the saturation current of the transistors Q1, Q2, Q3, Q4, Q5, Q6, Q7 and Q8 and $V_{BE3}$ is a base-to-emitter voltage of the transistor Q3, $V_T$ is the thermal voltage of the transistors Q1, Q2, Q3, Q4, Q5, Q6, Q7 and Q8. $V_T$ can be expressed as $V_T=(k_BT)/q$ using the Boltzmann's constant $k_B$, the absolute temperature T and the charge q of an electron.

When, the DC common-base current gain factor is defined as $\alpha_F$, $I_{C1}+I_{C2}+I_{C3}+I_{C4}+I_{C5}+I_{C6}+I_{C7}+I_{C8}=\alpha_F I_0$ is established, so that $\alpha_F I_0$ can be expressed as the following equation (19).

$$\alpha_F I_0 = I_S\exp\left(\frac{V_{BE3}}{V_T}\right)\left\{2\cosh\left(\frac{V_1+V_2}{2V_T}\right)+2\cosh\left(\frac{V_1-V_2}{2V_T}\right)+4\right\} \tag{19}$$

Therefore, the collector current $I_{C3}$ is given as the following expression (20).

$$I_{C3}=I_S\exp\left(\frac{V_{BE3}}{V_T}\right)=\frac{\alpha_F I_0}{2\left\{\cosh\left(\frac{V_1+V_2}{2V_T}\right)+\cosh\left(\frac{V_1-V_2}{2V_T}\right)+2\right\}} \tag{20}$$

The differential output current ΔI can be given as the following expression (21).

$$\begin{aligned}\Delta I &= I_L - I_R \\ &= (I_{C1}+I_{C2}+I_{C7}+I_{C8})-(I_{C3}+I_{C4}+I_{C5}+I_{C6}) \\ &= I_{C3}\left\{2\cosh\left(\frac{V_1+V_2}{2V_T}\right)-2\cosh\left(\frac{V_1-V_2}{2V_T}\right)\right\} \\ &= \frac{\alpha_F I_0\sinh\left(\frac{V_1}{2V_T}\right)\sinh\left(\frac{V_2}{2V_T}\right)}{\cosh\left(\frac{V_1}{2V_T}\right)+\cosh\left(\frac{V_2}{2V_T}\right)+1}\end{aligned} \tag{21}$$

Here, $\cosh X \geqq 1$, so that when $\cosh(V_1/2V_T).\cosh(V_2/2V_T)\geqq 1$ is established in the equation (21), "+1" in the denominator of the equation (21) can be ignored. Therefore, the differential output current ΔI can be approximated as the following equation (22).

$$\Delta I \approx \alpha_F I_0 \tanh(V_1/2V_T)\cdot\tanh(V_2/2V_T) \tag{22}$$

$$(|V_1| \geqq 2V_T,\ |V_2| \geqq 2V_T)$$

It is seen that the right member of the equation (22) is equal to $\alpha_F$ times as much as that of the equation showing the transconductance characteristics of the Gilbert cell multiplier. This means that the circuit shown in FIG. 3 has a multiplication characteristics.

Since the equation (21) contains the term "+1" in the denominator, it is considered that the characteristics of the multiplier of the embodiment becomes to diverge from that of the Gilbert cell multiplier when the input voltage ranges are $|V_1|\leqq 2V_T$ and $|V_2|\leqq 2V_T$. However, the differential output current is reduced in the small signal application due to the term "+1", so that linearity of the multiplication characteristics rather increases smoothly, which results in an improvement of the multiplication characteristics.

Figure 4:
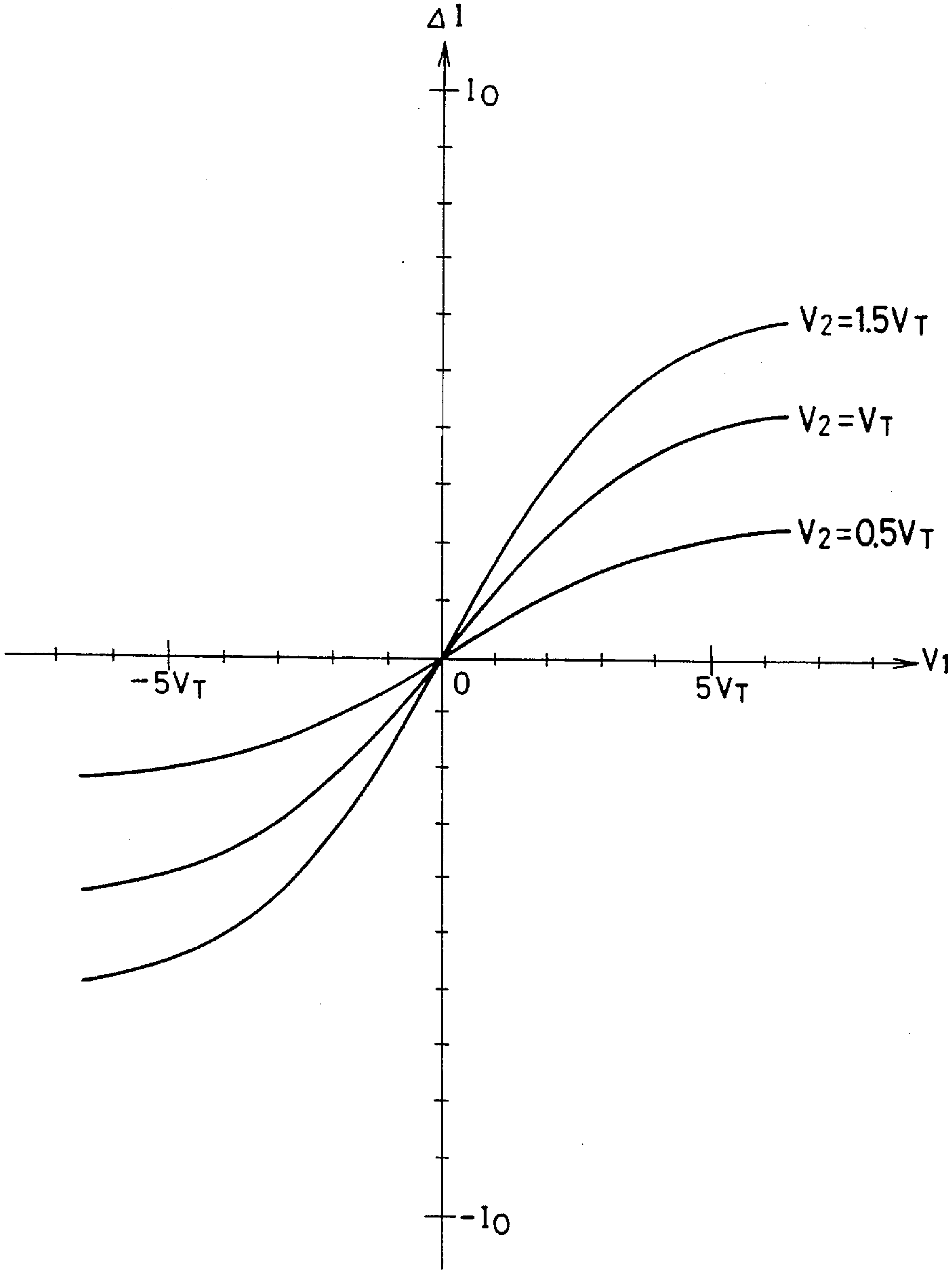
FIG. 4 is a diagram showing input-output characteristics of the multiplier shown in FIG. 3.

FIG. 4 shows transfer characteristics obtained from the equation (21). It is seen from FIG. 4 that the multiplier of the embodiment has an improved linearity of the transfer characteristics compared with the Gilbert cell multiplier and that it shows limiting characteristics in the large signal applications.

[Second Embodiment]

Figure 5:
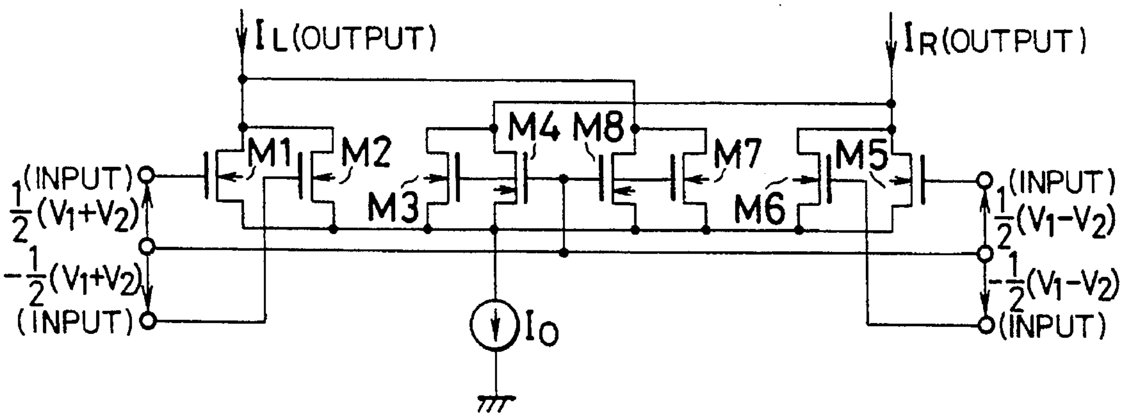
FIG. 5 is a circuit diagram of a multiplier using MOS transistors according to a second embodiment of the present invention.

FIG. 5 shows a multiplier according to a second embodiment, which is composed of eight MOS transistors M1, M2, M3, M4, M5, M6, M7 and M8 having the same capacities or a ratio (W/L) of a gate-width W to a gate-length L with each other, all of which are driven by a constant current source (current: $I_0$).

A first pair is formed of the transistors M1 and M2 whose output ends or drains are coupled together. A second pair is formed of the transistors M5 and M6 whose output ends or drains are coupled together. A third pair is formed of the transistors M7 and M8 whose output ends or drains are coupled together. A fourth pair is formed of the transistors M3 and M4 whose output ends or drains are coupled together.

Sources of the transistors M1, M2, M3, M4, M5, M6, M7 and M8 are connected in common to the constant current source.

The drains coupled of the transistors M1 and M2 of the first pair and the drains coupled of the transistors M7 and M8 of the third pair are coupled together to form one of a pair of differential output ends of the multiplier. The drains coupled of the transistors M5 and M6 of the second pair and the drains coupled of the transistors M3 and M4 of the fourth pair are coupled together to form the other of the pair of the differential output ends.

Input ends or gates of the transistors M7 and M8 of the third pair are coupled together and input ends or gates of the transistors M3 and M4 of the fourth pair are coupled together. These gates of the transistors M7, M8, M3 and M4 are further coupled together.

A half sum of first and second input voltages $V_1$ and $V_2$ to be multiplied is applied in positive phase to an input end or a gate of the transistor M1 of the first pair with the gates of the M7, M8, M3 and M4 as a standard or reference point. The half sum of the first and second input voltages $V_1$ and $V_2$ is applied in opposite phase to an input end or a gate of the transistor M2 thereof with the gates of the M7, M8, M3 and M4 as the standard point. Thus, a voltage $+(½)(V_1+V_2)$ is applied to the gate of the transistor M1 and a voltage $-(½)(V_1+V_2)$ is applied to the gate of the transistor M2.

A half difference of the first and second input voltages $V_1$ and $V_2$ is applied in positive phase to an input end or a gate of the transistor M5 of the second pair with the gates of the transistors M7, M8, M3 and M4 as the standard point. The half difference of the first and second input voltages $V_1$ and $V_2$ is applied in opposite phase to an input end or a gate of the transistor M6 thereof with the gates of the M7, M8, M3 and M4 as the standard point. Thus, a voltage $+(½)(V_1-V_2)$ is applied to the gate of the transistor M5 and a voltage $-(½)(V_1-V_2)$ is applied to the gate of the transistor M6.

Thus, the gates coupled together of the transistors M3, M4, M7 and M8 are applied with a direct current bias voltage.

With the multiplier shown in FIG. 5, assuming that all the transistors M1, M2, M3, M4, M5, M6, M7 and M8 are operating in the saturation regions, and that they have the square-law characteristics, respectively. Then, drain currents $I_{D1}$, $I_{D2}$, $I_{D3}$, $ID_{d4}$, $I_{D5}$, $I_{D6}$, $I_{D7}$ and $I_{D8}$ of the respective transistors M1, M2, M3, M4, M5, M6, M7 and M8 can be expressed as the following equations (23-1), (23-2), (23-3), (23-4), (23-5), (23-6), (23-7) and (23-8), respectively.

$$I_{D1}=\beta(V_{GS1}-V_{TH})^2 \quad (23\text{-}1)$$

$$I_{D2}=\beta(V_{GS2}-V_{TH})^2 \quad (23\text{-}2)$$

$$I_{D3}=\beta(V_{GS3}-V_{TH})^2 \quad (23\text{-}3)$$

$$I_{D4}=\beta(V_{GS4}-V_{TH})^2 \quad (23\text{-}4)$$

$$I_{D5}=\beta(V_{GS5}-V_{TH})^2 \quad (23\text{-}5)$$

$$I_{D6}=\beta(V_{GS6}-V_{TH})^2 \quad (23\text{-}6)$$

$$I_{D7}=\beta(V_{GS7}-V_{TH})^2 \quad (23\text{-}7)$$

$$I_{D8}=\beta(V_{GS8}-V_{TH})^2 \quad (23\text{-}8)$$

Therefore, the drain currents $I_{D1}$, $I_{D2}$, $I_{D3}$, $ID4$, $ID5$, $I_{D6}$, $I_{D7}$ and $I_{D8}$ are expressed as the following equations (24-1), (24-2), (24-3), (24-4) and (24-5), respectively.

$$I_{D1}=\beta\{(V_{GS3}+(½)(V_1+V_2)-V_{TH}\}^2 \quad (24\text{-}1)$$

$$I_{D2}=\beta\{(V_{GS3}-(½)(V_1+V_2)-V_{TH}\}^2 \quad (24\text{-}2)$$

$$I_{D3}=I_{D4}=I_{D7}=I_{D8}=\beta(V_{GS3}-V_{TH})^2 \quad (24\text{-}3)$$

$$I_{D5}=\beta\{V_{GS3}+(½)(V_1-V_2)-V_{TH}\}^2 \quad (24\text{-}4)$$

$$I_{D6}=\beta\{V_{GS3}-(½)(V_1-V_2)-V_{TH}\}^2 \quad (24\text{-}5)$$

Here, $I_{D1}+I_{D2}+I_{D3}+I_{D4}+I_{D5}+I_{D6}+I_{D7}+I_{D8}=I_0$ is established, so that a differential output current $\Delta I$ can be expressed as the following equations (25-1), (25-2), (25-3) and (25-4).

$$\begin{aligned}\Delta I &= I_L-I_R \\ &= (I_{D1}+I_{D2}+I_{D7}+I_{D8})-(I_{D3}+I_{D4}+I_{D5}+I_{D6}) \\ &= 2\beta V_X V_Y\left(|V_1| \leqq -\frac{2|V_2|}{3}+\frac{1}{3}\sqrt{\frac{3I_0}{\beta}-5V_2^2}\right)\end{aligned} \quad (25\text{-}1)$$

$$\begin{aligned}\Delta I = &\frac{12}{7}\beta V_1V_2+\left\{-\frac{1}{7}I_0-\frac{11}{49}\beta(|V_1|+|V_2|)^2+\right. \\ &\frac{8}{49}\beta(|V_1|+|V_2|)\cdot \\ &\left.\sqrt{7I_0-5(|V_1|+|V_2|)^2+4|V_1||V_2|}\right\}\mathrm{sgn}(V_1V_2) \\ &\left(-\frac{2|V_2|}{3}+\frac{1}{3}\sqrt{\frac{3I_0}{\beta}-5V_2^2} \leqq |V_1| \leqq \frac{2|V_2|}{3}+\right. \\ &\left.\frac{1}{3}\sqrt{\frac{3I_0}{\beta}-2V_2^2}\right)\end{aligned} \quad (25\text{-}2)$$

$$\begin{aligned}\Delta I = &\frac{2}{3}\beta V_1V_2+\left(\frac{1}{3}\sqrt{6I_0-2V_1^2-3V_2^2}\right)\mathrm{sgn}(V_1) \\ &\left(-\frac{2|V_2|}{3}+\right. \\ &\left.\frac{1}{3}\sqrt{\frac{3I_0}{\beta}-2V_2^2} \leqq |V_1| \leqq \sqrt{\frac{2I_0}{\beta}-V_2^2}\right)\end{aligned} \quad (25\text{-}3)$$

$$\begin{aligned}\Delta I = &\left(\beta V_2\sqrt{\frac{2I_0}{\beta}-V_2^2}\right)\mathrm{sgn}(V_1) \\ &\left(|V_1| \geqq \sqrt{\frac{2I_0}{\beta}-V_2^2}\right)\end{aligned} \quad (24\text{-}4)$$

In the equations (25-1), (25-2), (25-3) and (25-4), $V_{GS1}$, $V_{GS2}$, $V_{GS3}$, $V_{GS4}$, $V_{GS5}$, $V_{GS6}$, $V_{GS7}$ and $V_{GS8}$ are gate-source voltages of the transistors M1, M2, M3, M4, M5, M6, M7 and M8, respectively, $V_{TH}$ is the threshold voltage of these transistors and $\beta$ is the transconductance parameter of these transistors.

Figure 6:
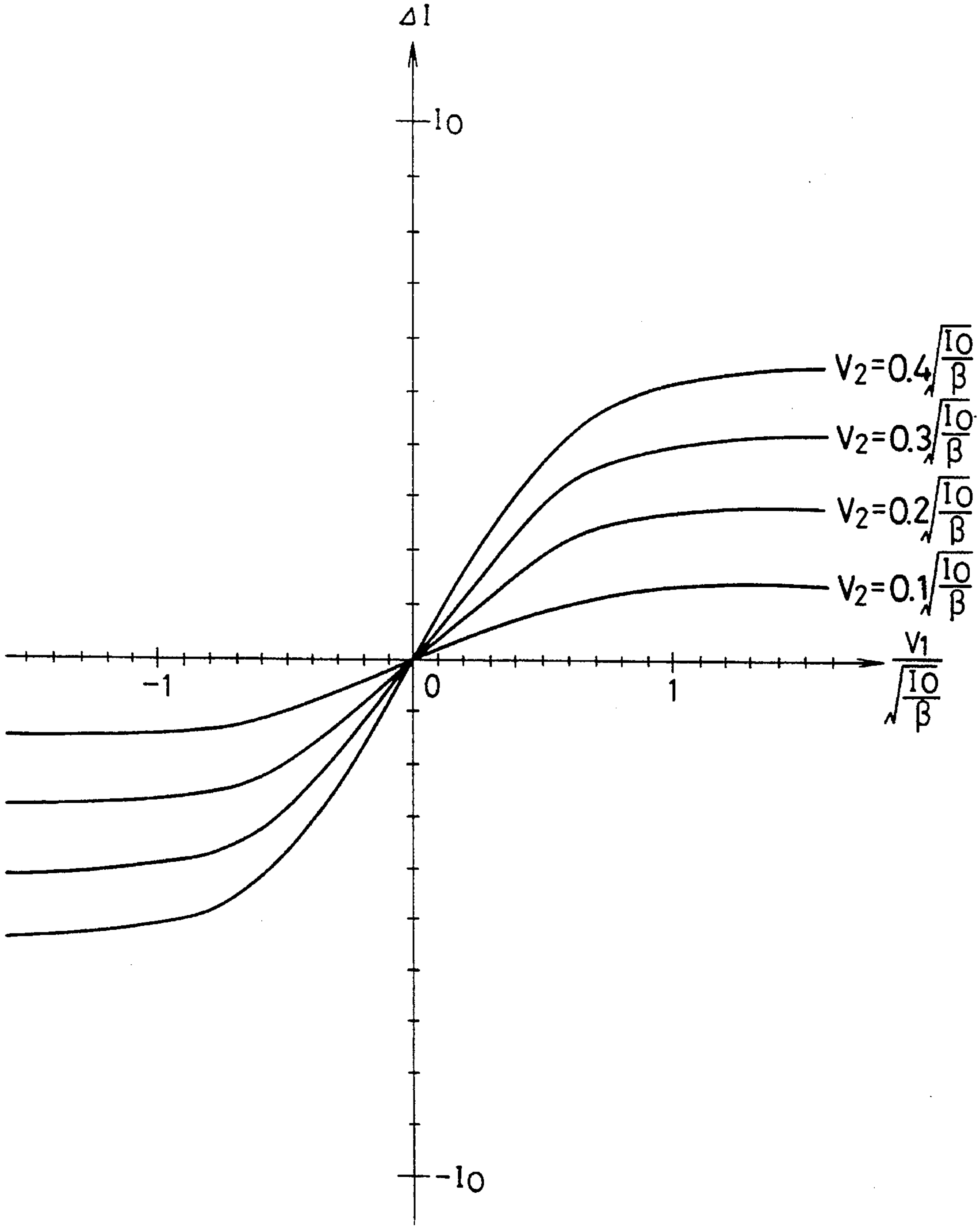
FIG. 6 is a diagram showing input-output characteristics of the multiplier shown in FIG. 5.

FIG. 6 shows transfer characteristics obtained from the equation (25) with the voltage $V_2$ as a parameter. It is seen from FIG. 6 that the multiplier of the second embodiment has an ideal multiplication characteristics when the square-law characteristics of the MOS transistors are established and that it shows limiting characteristics in the large signal applications.

[Third Embodiment]

Figure 7:
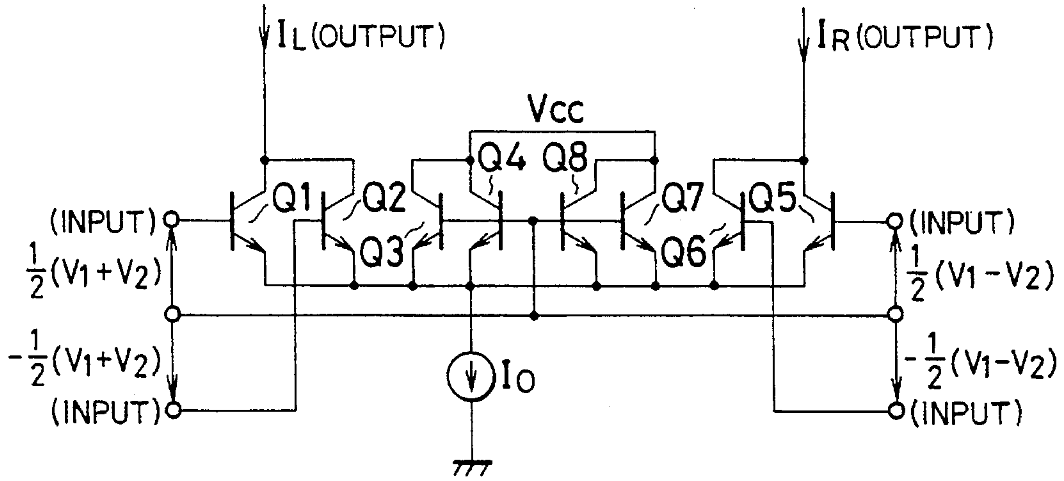
FIG. 7 is a circuit diagram of a multiplier using bipolar transistors according to a third embodiment of the present invention.

FIG. 7 shows a multiplier according to a third embodiment. The multiplier has the same configuration as that of the first embodiment shown in FIG. 3 excepting that the collectors coupled of the bipolar transistor Q3 and Q4 of the fourth pair and the collectors coupled of the bipolar transistor Q7 and Q8 of the third pair are separated from the pair of the differential output ends of the multiplier.

Here, the collectors coupled of the transistor Q3 and Q4 and the collectors coupled of the transistor Q7 and Q8 are coupled together to be applied with a power source voltage $V_{CC}$ for the multiplier.

Similar to the first embodiment, the bases of the transistors Q7 and Q8 of the third pair and the bases of the transistors Q3 and Q4 of the fourth pair are coupled together and the emitters of these transistors Q7, Q8, Q3 and Q4 are connected in common to the constant current source (current: $I_0$). Therefore, the collector currents the collector currents $I_{C3}$, $I_{C4}$, $I_{C7}$ and $I_{C8}$ of the respective transistors Q3, Q4, Q7 and Q8 are equal in value to each other.

It is seen from the equation (21) that the sum $(I_{C3}+I_{C4})$ of the current $I_{C3}$ and $I_{C4}$ and the sum $(I_{C7}+I_{C8})$ of the current $I_{C7}$ and $I_{C8}$ are cancelled with each other in the differential output current ΔI of the multiplier of this embodiment. Accordingly, the collectors of the four transistors Q3, Q4, Q7 and Q8 are not required to be coupled with the differential output ends of the multiplier as a result, the collectors of the four transistors Q3, Q4, Q7 and Q8 can be separated from the differential output ends.

In this embodiment, since the number of the transistors connected to the respective differential output ends becomes half, the collector capacitance can be reduced to half in value as much as that of the first embodiment. As a result, there is an advantage that the multiplier of the this embodiment can be improved up to twice in frequency characteristic as much as the first embodiment.

[Fourth Embodiment]

Figure 8:
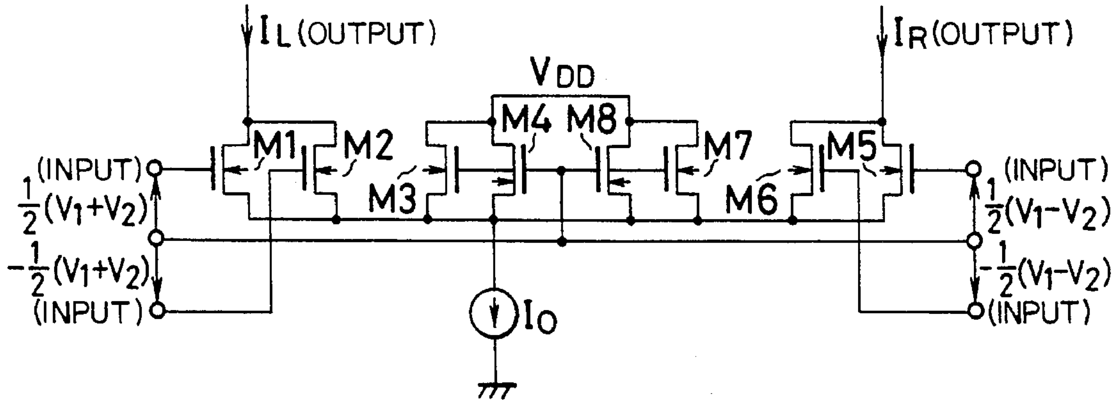
FIG. 8 is a circuit diagram of a multiplier using MOS transistors according to a fourth embodiment of the present invention.

FIG. 8 shows a multiplier according to a fourth embodiment. The multiplier has the same configuration as that of the second embodiment shown in FIG. 5 excepting that the drains coupled of the MOS transistor M3 and M4 of the fourth pair and the drains coupled of the MOS transistor M7 and M8 of the third pair are separated from the pair of the differential output ends of the multiplier.

Here, the drains coupled of the transistor M3 and M4 and the drain coupled of the transistor M7 and M8 are coupled together to be applied with a power source voltage $V_{CC}$ for the multiplier.

Similar to the second embodiment, the gates of the transistors M7 and M8 of the third pair and the gates of the transistors M3 and M4 of the fourth pair are coupled together and the sources of these transistors M7, M8, M3 and M4 are connected in common to the constant current source (current: $I_0$). Therefore, the drain currents $I_{D3}$, $I_{D4}$, $I_{D7}$ and $I_{D8}$ of the respective transistors M3, M4, M7 and M8 are equal in value to each other.

It is seen from the equations (25-1), (25-2) and (25-3) that the sum $(I_{D3}+I_{D4})$ of the current $I_{D3}$ and $I_{D4}$ and the sum $(I_{D7}+I_{D8})$ of the current $I_{D7}$ and $I_{D8}$ are cancelled with each other in the differential output current ΔI of the multiplier of this embodiment. Accordingly, the drains of the four transistors M3, M4, M7 and M8 are not required to be coupled with the differential output ends of the multiplier as a result, the drains of the four transistors M3, M4, M7 and M8 can be separated from the differential output ends.

In the fourth embodiment, similar to the third embodiment, there is an advantage that the multiplier of the this embodiment can be improved up to twice in frequency characteristic as much as the second embodiment.

[Fifth Embodiment]

Figure 9:
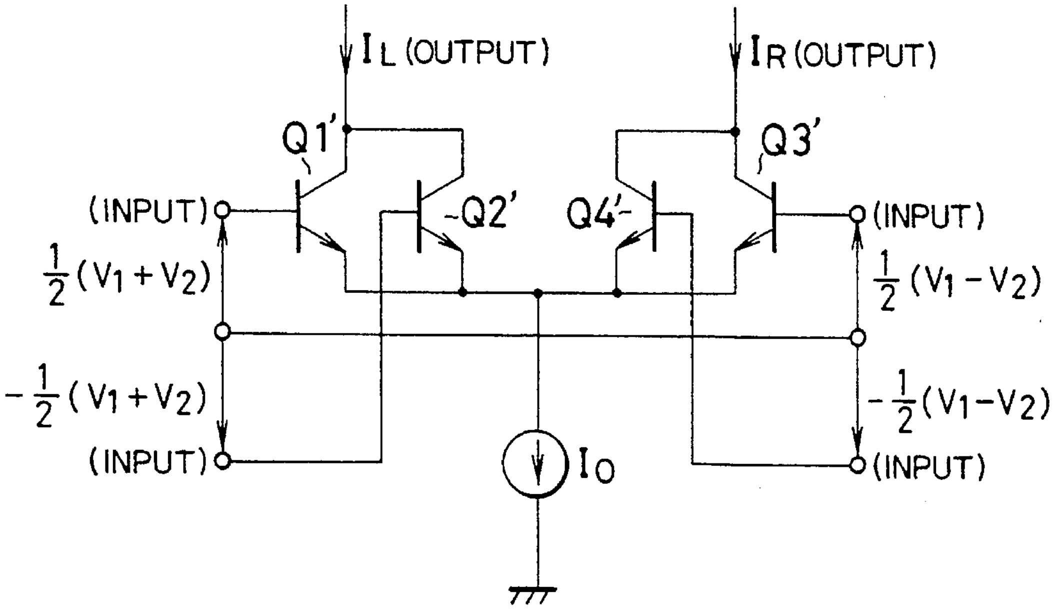
FIG. 9 is a circuit diagram of a multiplier using bipolar transistors according to a fifth embodiment of the present invention.

FIG. 9 shows a multiplier according to a fifth embodiment. The multiplier is equivalent in configuration to one which is obtained by removing the bipolar transistors Q3, Q4, Q7 and Q8 from that of the first or third embodiment respectively shown in FIGS. 3 and 7.

As shown in FIG. 9, the multiplier of the fifth embodiment is composed of four bipolar transistors Q1', Q2', Q3' and Q4' having the same capacity or the same emitter area with each other, all of which are driven by a constant current source (current: $I_0$).

A first pair is formed of the transistors Q1' and Q2' whose output ends or collectors are coupled together. A second pair is formed of the transistors Q3' and Q4' whose output ends or collectors are coupled together. The collectors thus coupled of the transistors Q1' and Q2' form one of a pair of differential output ends of the multiplier. The collectors thus coupled of the transistors Q3' and Q4' form the other of the pair of the differential output ends.

Emitters of the transistors Q1', Q2', Q3' and Q4' are connected in common to the constant current source.

A half sum of first and second input voltages $V_1$ and $V_2$ to be multiplied is applied in positive phase to a base of the transistor Q1' of the first pair with respect to a standard or reference point. The half sum of the first and second input voltages $V_1$ and $V_2$ is applied in opposite phase to a base of the transistor Q2' thereof with respect to the standard point. Thus, a voltage $+(½)(V_1+V_2)$ is applied to the base of the transistor Q1' and a voltage $-(½)(V_1+V_2)$ is applied to the base of the transistor Q27.

A half difference of the first and second input voltages $V_1$ and $V_2$ is applied in positive phase to a base of the transistor Q3' of the second pair with respect to the standard point. The half difference of the first and second input voltages $V_1$ and $V_2$ is applied in opposite phase to a base of the transistor Q4' thereof with respect to the standard point. Thus, a voltage $+(½)(V_1-V_2)$ is applied to the base of the transistor Q3' and a voltage $-(½)(V_1-V_2)$ is applied to the base of the transistor Q4'.

Here, the circuit having the four transistors driven by one constant current source thus above-described is called as a "quadritail cell".

As described above about the third embodiment, the same bias voltage is applied respectively to the transistors Q3, Q4, Q7 and Q8 and the differential output current ΔI does not contain the collector currents $I_{C3}$, $I_{C4}$, $I_{C7}$ and $I_{C8}$ of these transistors because these collector currents are cancelled with each other. As a result, the operation of the multiplier of the fifth embodiment is similar to that of the first and third embodiments.

Assuming that the four transistors Q1', Q2', Q3' and Q4' are matched in characteristics and ignoring the base-width modulation, collector currents $I_{C1}'$, $I_{C2}'$, $I_{C3}'$ and $I_{C4}'$ of the respective transistors Q1', Q27, Q3' and Q4' can be expressed as the following equations (26-1), (26-2), (26-3) and (26-4), respectively.

$$I_{C1}'=I_S \exp[\{V_{BE}+(½)(V_1+V_2)\}/V_T] \quad (26\text{-}1)$$

$$I_{C2}'=I_S \exp[\{V_{BE}-(½)(V_1+V_2)\}/V_T] \quad (26\text{-}2)$$

$$I_{C3}'=I_S \exp[\{V_{BE}+(½)(V_1-V_2)\}/V_T] \quad (26\text{-}4)$$

$$I_{C4}'=I_S \exp[\{V_{BE}-(½)(V_1-V_2)\}/V_T] \quad (26\text{-}5)$$

where $I_S$ is the saturation current of the transistors Q1', Q2', Q3' and Q4' and $V_{BE}$ is base-to-emitter voltages of these four transistors, $V_T$ is the thermal voltage of these transistors.

When, the DC common-base current gain factor is defined as $\alpha_F$, $I_{C1}'+I_{C2}'+I_{C3}'+I_{C4}'=\alpha F\ I_0$ is established, so that $\alpha_F I_0$ can be expressed as the following equation (27).

$$\alpha_F I_0 = 2I_S \exp\left(\frac{V_{BE}}{V_T}\right)\left\{\cosh\left(\frac{V_1+V_2}{2V_T}\right)+2\cosh\left(\frac{V_1-V_2}{2V_T}\right)+4\right\} \quad (27)$$

As a result, the differential output current ΔI can be given as the following expression (28).

$$\begin{aligned}\Delta I &= I_L - I_R = (I_{C1} + I_{C2}) - (I_{C3} + I_{C4}) \qquad (28)\\ &= \frac{\alpha_F I_0 \left\{ \cosh\left(\frac{V_1+V_2}{2V_T}\right) - \sinh\left(\frac{V_1-V_2}{2V_T}\right) \right\}}{\cosh\left(\frac{V_x}{2V_T}\right) + \cosh\left(\frac{V_y}{2V_T}\right)}\\ &= \alpha_F I_0 \tanh\left(\frac{V_1}{2V_T}\right) \tanh\left(\frac{V_2}{2V_T}\right)\end{aligned}$$

It is seen that the right member of the equation (28) is equal to $\alpha_F$ times as much as that of the equation showing the transconductance characteristics of the Gilbert cell multiplier. This means that the circuit shown in FIG. 9 has a multiplication characteristics.

Since the equation (28) contains the first power of $\alpha_F$, it is seen that there is only one p-n junction, which means that a plurality of transistors are not arranged stacked. Therefore, in the fifth embodiment, the power source voltage can be reduced in value by the voltage drop of the p-n junction. Practically, the amplitudes of the first and second input voltages $V_1$ and $V_2$ are not required to be considered, so that the power source voltage can be reduced by about one volt.

Figure 10:
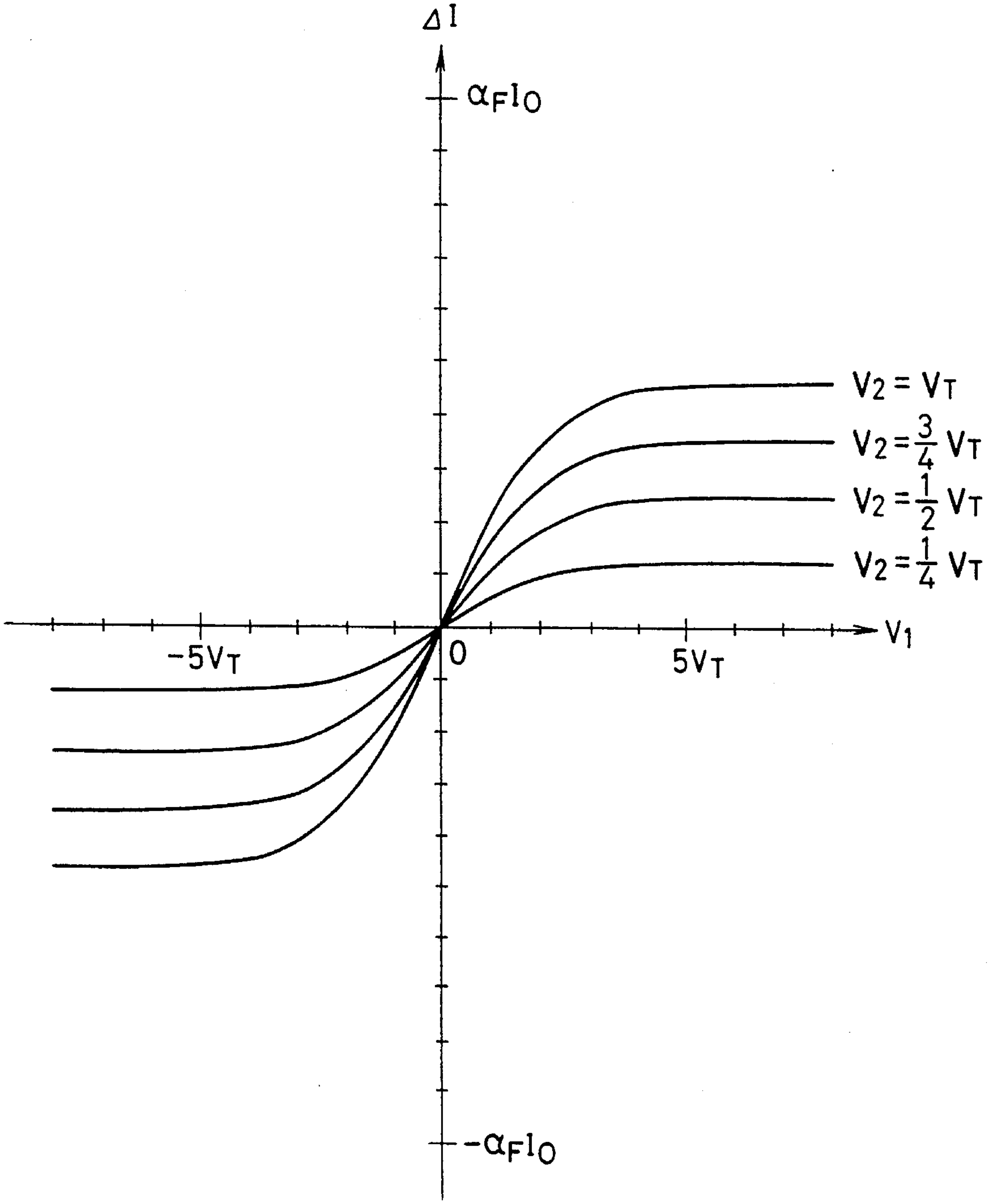
FIG. 10 is a diagram showing input-output characteristics of the multiplier shown in FIG. 9.

FIG. 10 shows the transfer characteristics obtained from the equation (28). It is seen from FIG. 10 that the characteristics of this multiplier is equal to those of the Gilbert cell multiplier if the value of $\alpha_F$ is 1.

[Sixth Embodiment]

Figure 11:
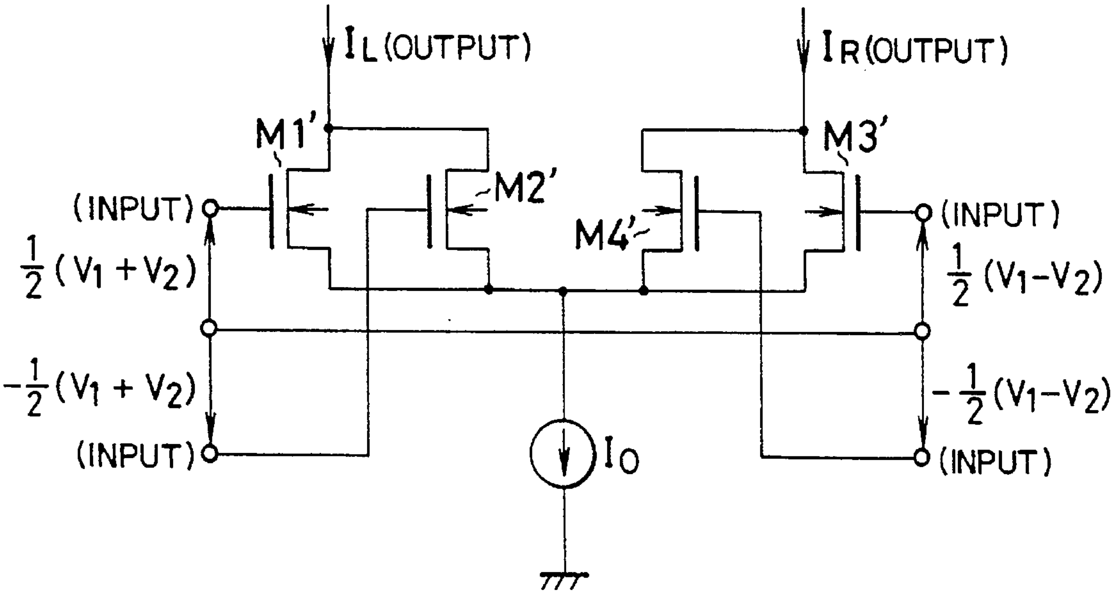
FIG. 11 is a circuit diagram of a multiplier using MOS transistors according to a sixth embodiment of the present invention.

FIG. 11 shows a multiplier according to a sixth embodiment. The multiplier is equivalent in configuration to one which is obtained by removing the MOS transistors M3, M4, M7 and M8 from that of the second or fourth embodiment respectively shown in FIGS. 5 and 8.

As shown in FIG. 11, the multiplier of the sixth embodiment is composed of four MOS transistors M1', M2', M3' and M4' having the same capacity or the same ratio (W/L) of a gate-width W to a gate-length L with each other, all of which are driven by a constant current source (current: $I_0$).

A first pair is formed of the transistors M1' and M2' whose drains are coupled together. A second pair is formed of the transistors M3' and M4' whose drains are coupled together. The drains thus coupled of the transistors M1' and M2' form one of a pair of differential output ends of the multiplier. The drains thus coupled of the transistors M3' and M4' form the other of the pair of the differential output ends.

Sources of the transistors M1', M2', M3' and M4' are connected in common to the constant current source.

A half sum of first and second input voltages $V_1$ and $V_2$ to be multiplied is applied in positive phase to a gate of the transistor M1' of the first pair with respect to a standard or reference point. The half sum of the first and second input voltages $V_1$ and $V_2$ is applied in opposite phase to a gate of the transistor M2' thereof with respect to the standard point. Thus, a voltage $+(½)(V_1+V_2)$ is applied to the gate of the transistor M1' and a voltage $-(½)(V_1+V_2)$ is applied to the gate of the transistor M2.

A half difference of the first and second input voltages $V_1$ and $V_2$ is applied in positive phase to a gate of the transistor M3' of the second pair with respect to the standard point. The half difference of the first and second input voltages $V_1$ and $V_2$ is applied in opposite phase to a gate of the transistor M4' thereof with respect to the standard point. Thus, a voltage $+(½)(V_1-V_2)$ is applied to the gate of the transistor M3' and a voltage $-(½)(V_1-V_2)$ is applied to the gate of the transistor M4'.

As described above about the fourth embodiment, the same bias voltage is applied respectively to the transistors M3, M4, M7 and M8 and the differential output current ΔI does not contain the drain currents $I_{D3}$, $I_{D4}$, $I_{D7}$ and $I_{D8}$ of these transistors because these drain currents are cancelled with each other. As a result, the operation of the multiplier of the sixth embodiment is similar to that of the second and fourth embodiments.

Here, we assume that the four transistors M1', M2', M3' and M4' are matched in characteristics and that all the transistors M1', M2', M3' and M4' are operating in the respective saturation regions so that the relationships between the drain currents $I_{D1}'$, $I_{D2}'$, $I_{D3}'$ and $I_{D4}'$ of the respective transistors M1', M2, M3' and M4' and the gate-to-source voltages thereof are in the square-law characteristics. Besides, we ignore the gate-width modulation and the body effect. Then, the drain currents $I_{D1}'$, $I_{D2}'$, $I_{D3}'$ and $I_{D4}'$ can be expressed as the following equations (29-1), (29-2), (29-3) and (29-4), respectively, where $V_{GS} \geqq V_{TH}$.

$$I_{D1} = \beta \left\{ V_{GS} + \frac{1}{2}(V_1+V_2) - V_{TH} \right\}^2 \qquad (29\text{-}1)$$

$$I_{D2} = \beta \left\{ V_{GS} - \frac{1}{2}(V_1+V_2) - V_{TH} \right\}^2 \qquad (29\text{-}2)$$

$$I_{D3} = \beta \left\{ V_{GS} + \frac{1}{2}(V_1-V_2) - V_{TH} \right\}^2 \qquad (29\text{-}3)$$

$$I_{D4} = \beta \left\{ V_{GS} - \frac{1}{2}(V_1-V_2) - V_{TH} \right\}^2 \qquad (29\text{-}4)$$

Here, $I_{D1}+I_{D2}+I_{D3}+I_{D4}=I_0$ is established. The differential output current ΔI is given as the following equation (30-1), (30-2) and (30-3).

$$\begin{aligned}\Delta I &= I_L - I_R = (I_{D1} + I_{D2}) - (I_{D3} + I_{D4}) \qquad (30\text{-}1)\\ &= 2\beta V_x V_y \left( |V_1| \leqq -\frac{|V_2|}{2} + \frac{1}{2}\sqrt{\frac{2I_0}{\beta} - 3V_2^2} \right)\end{aligned}$$

$$\begin{aligned}\Delta I = {} & \frac{4}{3}\beta V_1 V_2 - \frac{1}{9}\Big\{3I_0 + \beta(|V_1|+|V_2|)^2 - 4\beta(|V_1|+|V_2|)\cdot \qquad (30\text{-}2)\\ & \sqrt{\frac{3I_0}{\beta} - 2(|V_1|+|V_2|)^2 + 6|V_1||V_2|}\Big\}\,\mathrm{sgn}(V_1V_2)\\ & \left( -\frac{|V_2|}{2} + \sqrt{\frac{I_0}{2\beta} - \frac{3}{4}V_2^2} \leqq |V_1| \leqq \frac{5|V_2|}{6} + \sqrt{\frac{I_0}{2\beta} - \frac{11}{36}V_2^2} \right)\end{aligned}$$

$$\Delta I = \left( \beta V_2 \sqrt{\frac{I_0}{\beta} - V_2^2} \right) \mathrm{sgn}(V_1) \left( |V_1| \leqq \frac{5|V_2|}{6} + \sqrt{\frac{I_0}{2\beta} - \frac{11}{36}V_2^2} \right) \qquad (30\text{-}3)$$

Figure 12:
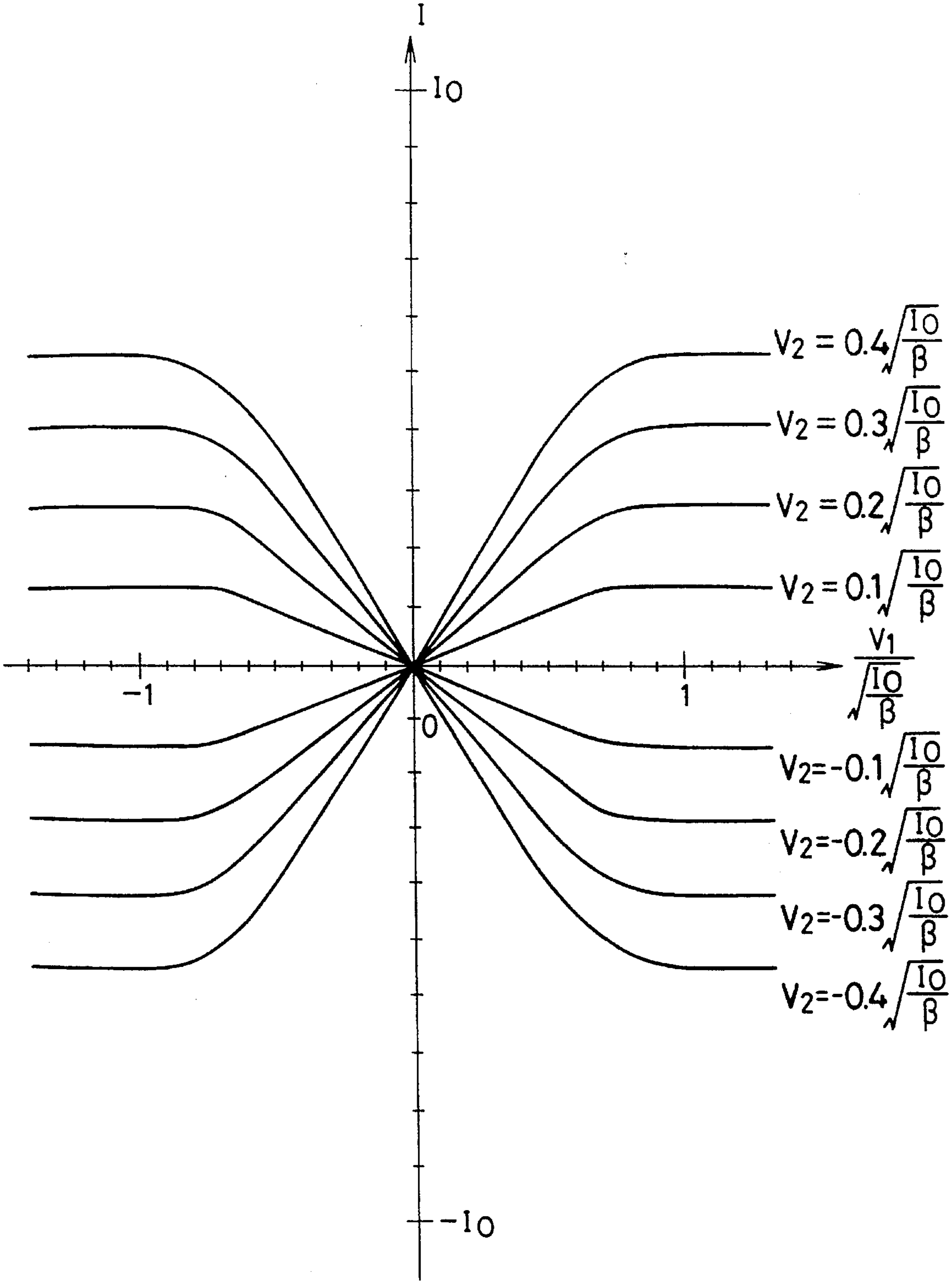
FIG. 12 is a diagram showing input-output characteristics of the multiplier shown in FIG. 11.

FIG. 12 shows transfer characteristics obtained from the equations (30-1), (30-2) and (30-3) with the voltage $V_2$ as a parameter. It is seen from FIG. 12 that the multiplier of the sixth embodiment has an ideal multiplication characteristics when the square-law characteristics of the MOS transistors are established and that it shows limiting characteristics in the large signal applications.

In the first, third and fifth embodiments shown in FIGS. 3, 7 and 9 using bipolar transistors, emitter resistors may be provided to enlarge the input voltage ranges of the multipliers. One emitter resistor may be inserted to each transistors or one common emitter resistor may be inserted at each transistor pair whose collectors are coupled together.

The transfer characteristic of a differential pair formed of bipolar transistors having a common emitter resistor or individual emitter resistors becomes similar to that of the differential pair formed of MOS transistors due to the emitter resistors. It is needless to say that the input voltage range of the bipolar multiplier can be enlarged if each emitter resistor for degeneration is made optimum in resistance value.

In the above-described embodiments, the sum and difference of the first and second input voltages $V_1$ and $V_2$ can be obtained by the following ways:

The difference voltage ($V_1-V_2$) can be obtained as an output of a differential amplifier when the first and second input voltages $V_1$ and $V_2$ are applied respectively to differential input ends of the differential amplifier.

A voltage $-V_2$ opposite in phase the second voltage $V_2$ can be obtained as an output of an inverting amplifier or as an opposite-phase output of a differential amplifier, an input voltage of which is $V_2$. Accordingly, the sum voltage ($V_1+V_2$) can be obtained as an output of a differential amplifier when the opposite-phase second voltage $-V_2$ thus obtained and the first input voltage $V_1$ are applied respectively to differential input ends of the differential amplifier.

In addition, in the case of the sum and difference of the first and second input voltages $V_1$ and $V_2$ are obtained as a differential output of the differential amplifier, there may be provided with two resistors having the same resistance value and connected in series between the differential output ends of the differential amplifier. Then, the middle point voltage of the input voltages $V_1$ and $V_2$ can be obtained at the connection point of the resistors, so that the middle point voltage thus obtained may be employed as the bias voltage applied to the common-connected bases of the transistors Q3, Q4, Q7 and Q8 in the first or third embodiment shown in FIGS. 3 or 7.

Figure 1:
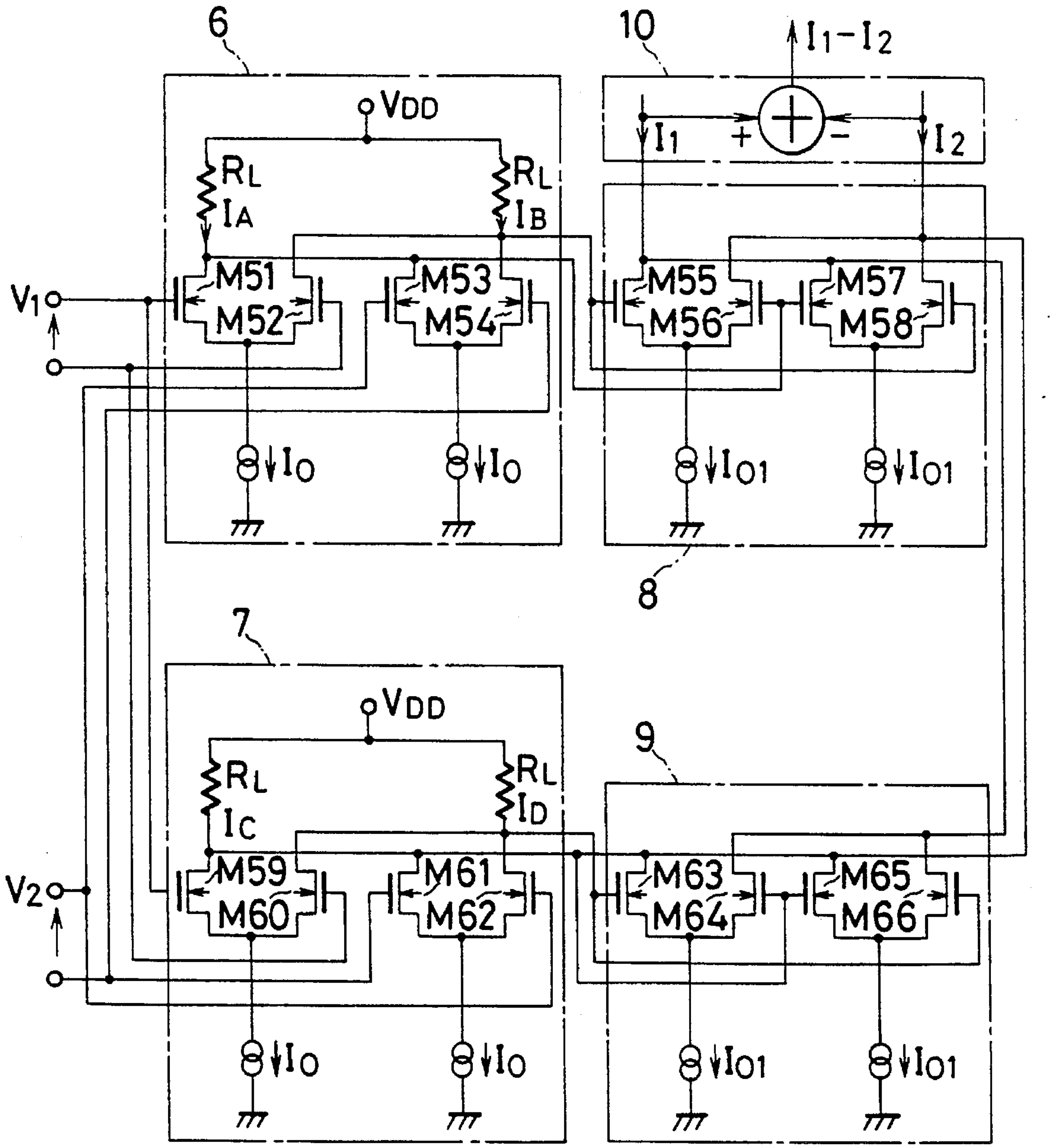
FIG. 1 PRIOR ART
FIG. 1 is a circuit diagram showing a prior-art multiplier.
Figure 2:
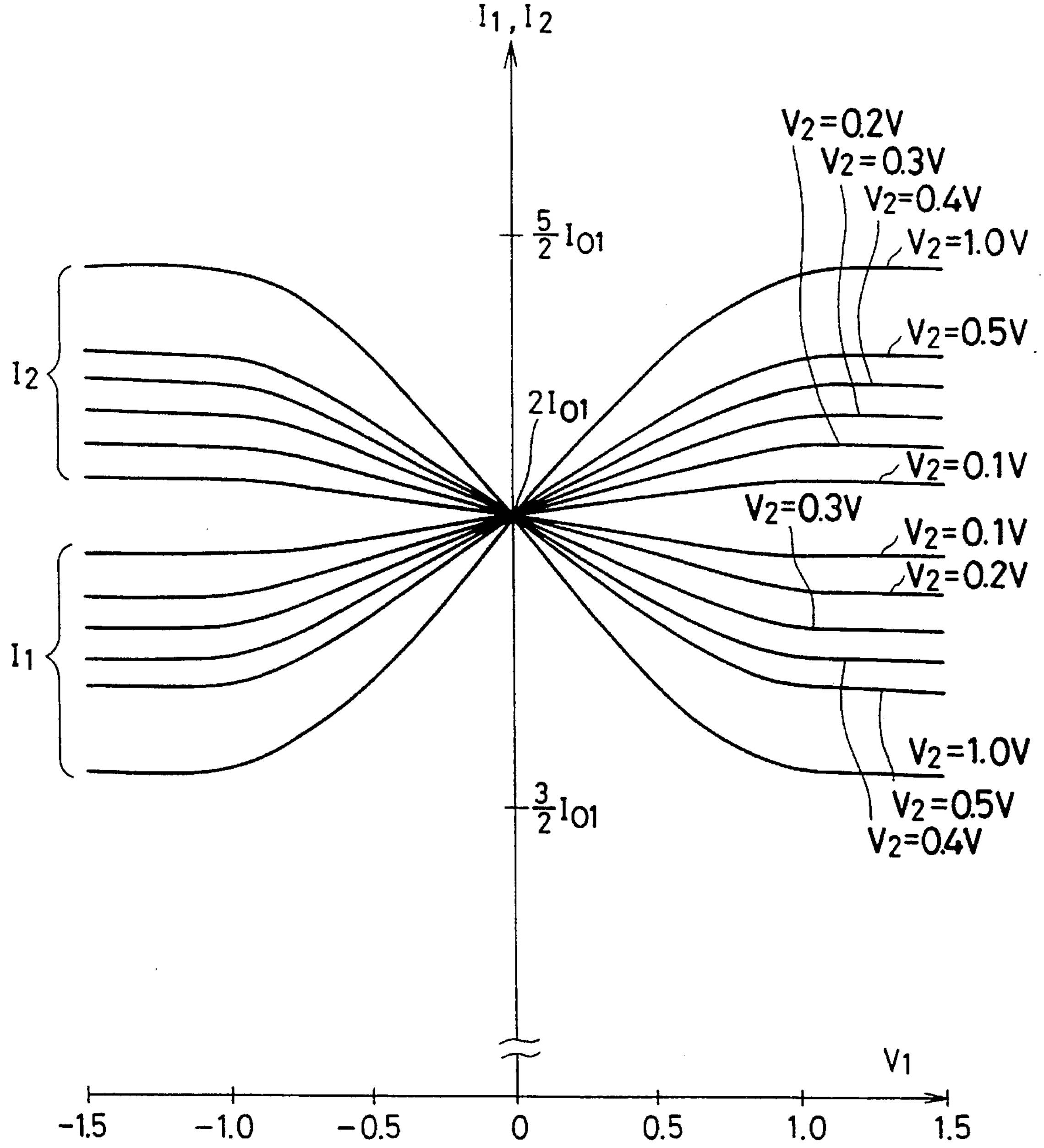
FIG. 2 PRIOR ART
FIG. 2 is a graph showing input-output characteristics of the prior-art multiplier shown in FIG. 1.
Figure 13:
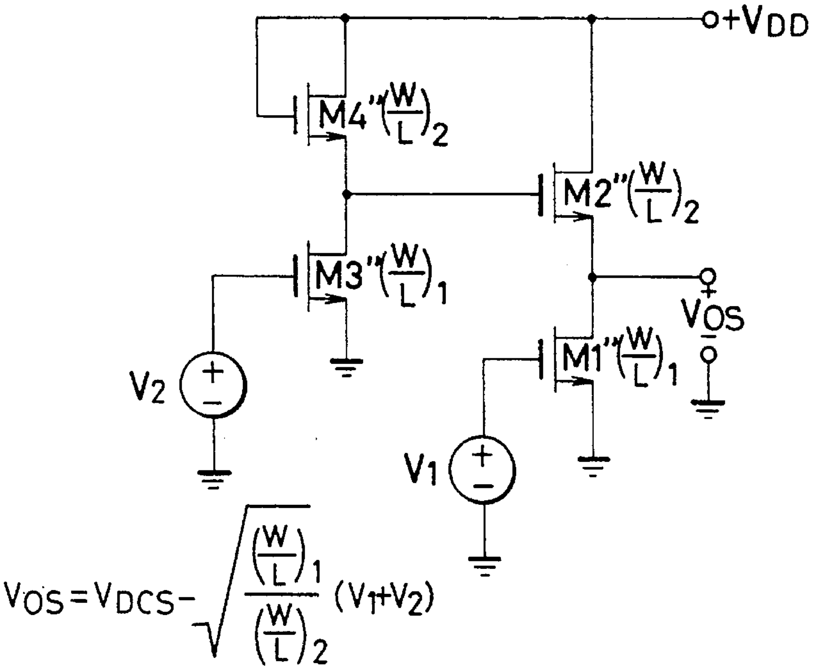
FIG. 13 is a circuit diagram of an adder or substracter to be used for the multiplier according to the present invention.
Figure 14:
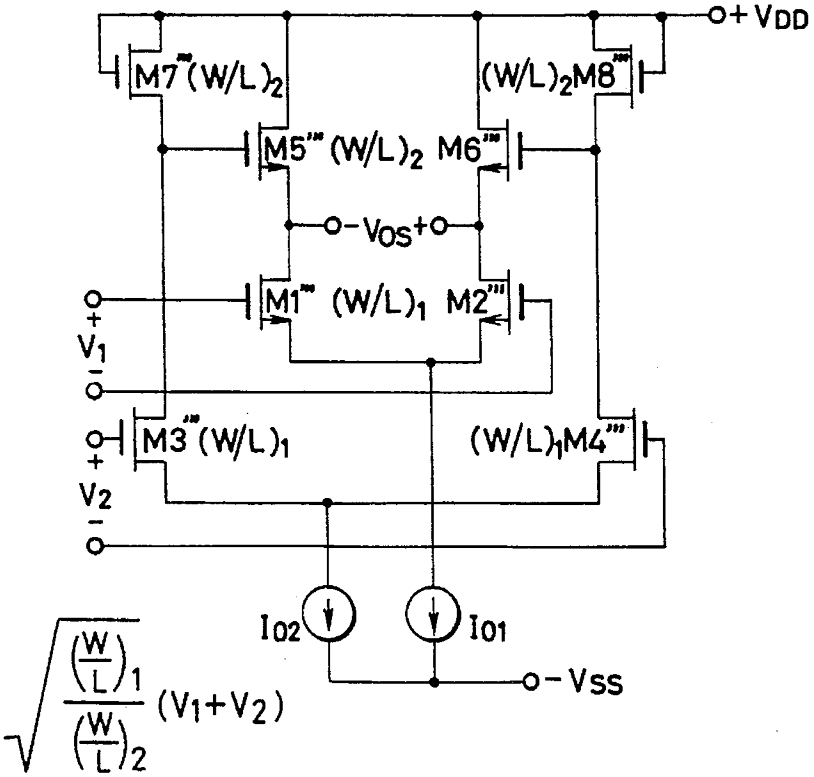
FIG. 14 is another circuit diagram of an adder or substracter to be used for the multiplier according to the present invention.

Further in addition, as an adder or subtracter for the first and second input voltages $V_1$ and $V_2$, not only the prior-art adder or subtracter shown in FIG. 1 but also circuits shown in FIGS. 13 and 14 which are disclosed in IEEE Journal of Solid-State Circuits, Vol. SC-22, No.6, pp.1064–1073, December 1987 (corresponding to U.S. Pat. No. 4,546,275) may be used.

As described above, with the multipliers of the first to sixth embodiments, four or two pairs of bipolar or MOS transistors having the same capacity are driven by one constant current source. Therefore, the multipliers can be composed of only the minimum unit transistors and as a result, simplification of a circuit configuration, reduction of a current consumption, improvement of high-frequency characteristics and reduction of a power source voltage can be realized.

What is claimed is:

1. A multiplier comprising:

a first pair of first and second transistors whose capacities are the same and whose output ends are coupled together;

a second pair of third and fourth transistors whose capacities are the same and whose output ends are coupled together;

a third pair of fifth and sixth transistors whose capacities are the same and whose output ends are coupled together;

a fourth pair of seventh and eighth transistors whose capacities are the same and whose output ends are coupled together;

a constant current source for driving said first, second, third and fourth pairs, said constant current source being connected to emitters or sources of said first, second, third, fourth, fifth, sixth, seventh and eighth transistors;

a half of a sum of first and second input voltages being applied in positive phase across an input end of said first transistor of said first pair and a reference point;

said half of a sum of said first and second input voltages being applied in negative phase across an input end of said second transistor of said first pair and said reference point;

a half of a difference of said first and second input voltages being applied in positive phase across an input end of said third transistor of said second pair and said reference point;

said half Of a difference of said first and second input voltages being applied in negative phase across an input end of said second transistor of said second pair and said reference point;

input ends of said fifth and sixth transistors of said third pair and input ends of said seventh and eighth transistors of said fourth pair being coupled together to be connected to said reference point;

said reference point being applied with a dc reference voltage;

said coupled output ends of said first pair and said coupled output ends of said third pair being coupled together to form one of a pair of differential output ends; and said coupled output ends of said second pair and said coupled output ends of said fourth pair being coupled together to form the other of said pair of differential output ends;

wherein an output, or a multiplication result of said first and second input voltages, of said multiplier is derived from said pair of differential output ends.

2. A multiplier as claimed in claim 1, wherein said dc reference voltage is a middle level of said sum and difference of said first and second input voltages.

3. A multiplier comprising:

a first pair of first and second transistors whose capacities are the same and whose output ends are coupled together;

a second pair of third and fourth transistors whose capacities are the same and whose output ends are coupled together;

a third pair of fifth and sixth transistors whose capacities are the same and whose output ends are coupled together;

a fourth pair of seventh and eighth transistors whose capacities are the same and whose output ends are coupled together;

a constant current source for driving said first, second, third and fourth pairs, said constant current source being connected to emitters or sources of said first, second, third, fourth, fifth, sixth, seventh and eighth transistors;

a half of a sum of first and second input voltages being applied in positive phase across an input end of said first transistor of said first pair and said reference point;

said half of a sum of said first and second input voltages being applied in negative phase across an input end of said second transistor of said first pair and said reference point;

a half of a difference of said first and second input voltages being applied in negative phase across an input end of said third transistor of said second pair and said reference point;

said half of a difference of said first and second input voltages being applied in negative phase across an input end of said second transistor of said second pair and said reference point;

input ends of said fifth and sixth transistors of said third pair and input ends of said seventh and eighth transistors of said fourth pair being coupled together to be connected to said reference point;

said reference point being applied with a dc reference voltage;

said coupled output ends of said first pair forming one of a pair of differential output ends and said coupled output ends of said second pair forming the other of said pair of differential output ends; and said coupled output ends of said third pair and said coupled output ends of said fourth pair being separated from said pair of differential output ends, respectively;

wherein an output, or a multiplication result of said first and second input voltages, of said multiplier is derived from said pair of differential output ends.

4. A multiplier as claimed in claim 3, wherein said dc reference voltage is a middle level of said sum and difference of said first and second input voltages.

5. A multiplier as claimed in claim 3, wherein said coupled output ends of said third pair and said coupled output ends of said fourth pair are coupled together.

6. A multiplier as claimed in claim 5, wherein said output ends of said third and fourth pairs that are coupled together are applied with a second dc reference voltage.

7. A multiplier comprising:

a first pair of first and second bipolar transistors whose capacities are the same and whose collectors are coupled together;

a second pair of third and fourth bipolar transistors whose capacities are the same and whose collectors are coupled together;

a third pair of fifth and sixth bipolar transistors whose capacities are the same and whose collectors are coupled together;

a fourth pair if seventh and eighth bipolar transistors whose capacities are the same and whose collectors are coupled together;

a constant current source for driving said first, second, third and fourth pairs, emitters of said first to eighth transistors being connected in common to said constant current source;

a half of a sum of first and second input voltages being applied in positive phase across a base of said first transistor of said first pair and a reference point;

said half of a sum of said first and second input voltages being applied in negative phase across a base of said second transistor of said first pair and said reference point;

a half of a difference of said first and second input voltages being applied in positive phase across an input end of said third transistor of said second pair and said reference point;

said half of a difference of said first and second input voltages being applied in negative phase across an input end of said fourth transistor of said second pair and said reference point;

bases of said fifth and sixth transistors of said third pair and bases of said seventh and eighth transistors of said fourth pair being coupled together to be applied with a dc reference voltage;

said coupled collectors of said first and second transistors of said first pair and said coupled collectors of said fifth and sixth transistors of said third pair being coupled together to form one of a pair of differential output ends; and said coupled collectors of said third and fourth transistors of said second pair and said coupled collectors of said seventh and eighth transistors of said fourth pair being coupled together to form the other of said pair of differential output ends;

wherein an output, or a multiplication result of said first and second input voltages, of said multiplier is derived from said pair of differential output ends.

8. A multiplier as claimed in claim 7, wherein said dc reference voltage is a middle level of said sum and difference of said first and second input voltages.

9. A multiplier comprising:

a first pair of first and second bipolar transistors whose capacities are the same and whose collectors are coupled together;

a second pair of third and fourth bipolar transistors whose capacities are the same and whose collectors are coupled together;

a third pair of fifth and sixth bipolar transistors whose capacities are the same and whose collectors are coupled together;

a fourth pair of seventh and eighth transistors whose capacities are the same and whose collectors are coupled together;

a constant current source for driving the first, second, third and fourth pairs, emitters of said first to eighth transistors being connected in common to said constant current source;

a half of a sum of first and second input voltages being applied in positive phase across a base of said first transistor of said first pair and a reference point;

said half of a sum of said first and second input voltages being applied in negative phase across a base of said second transistor of said first pair and said reference point;

a half of a difference of said first and second input voltages being applied in positive phase across a base of said third transistor of said second pair and said reference point;

said half of a difference of said first and second input voltages being applied in negative phase across a base of said fourth transistor of said second pair and said reference point;

bases of said fifth and sixth transistors of said third pair and bases of said seventh and eighth transistors of said fourth pair being coupled together to be applied with a dc reference voltage;

said coupled collectors of said first and second transistors of said first differential pair forming one of a pair of differential output ends and said collectors coupled of said third and fourth transistors of said second pair forming the other of said pair of differential output ends; and said coupled collectors of said fifth and sixth transistors of said third pair and said collectors coupled of said seventh and eighth transistors of said fourth pair being separated from said pair of differential output ends, respectively;

wherein an output, or a multiplication result of said first and second input voltages, of said multiplier is derived from said pair of differential output ends.

10. A multiplier as claimed in claim 9, wherein said dc reference voltage is a middle level of said sum and difference of said first and second input voltages.

11. A multiplier as claimed in claim 10, wherein said coupled collectors of said fifth and sixth transistors of said third pair and said coupled collectors of said seventh and eighth transistors of said fourth pair are coupled together.

12. A multiplier comprising:

a first pair of first and second MOS transistors whose capacities are the same and whose drains are coupled together;

a second pair of third and fourth MOS transistors whose capacities are the same and whose drains are coupled together;

a third pair of fifth and sixth MOS transistors whose capacities are the same and whose drains are coupled together;

a fourth pair of seventh and eighth MOS transistors whose capacities are the same and whose drains are coupled together;

a constant current source for driving said first, second, third and fourth pairs, sources of said first to eighth transistors being connected in common to said constant current source;

a half of a sum of first and second input voltages being applied in positive phase across a gate of said first transistor of said first pair and a reference point;

said half of a sum of said first and second input voltages being applied in negative phase across a gate of said third transistor of said first pair and said reference point;

a half of a difference of said first and second input voltages being applied in positive phase across a gate of said third transistor of said second pair and said reference point;

said half of a difference of said first and second input voltages being applied in negative phase across a gate of said fourth transistor of said second pair and said reference point;

gates of said fifth and sixth transistors of said third pair and gates of said seventh and eighth transistors of said fourth pair being coupled together to be applied with dc reference voltage;

said coupled drains of said first and second transistors of said first pair and said coupled drains of said fifth and sixth transistors of said third pair being coupled together to form one of a pair of differential output ends; and said coupled drains of said third and fourth transistors of said second pair and said coupled drains of seventh and eighth transistors of said fourth pair being coupled together to form the other of said pair of differential output ends;

wherein an output, or a multiplication result of said first and second input voltages, of said multiplier is derived from said pair of differential output ends.

13. A multiplier as claimed in claim 12, wherein said dc reference voltage is a middle level of said sum and difference of said first and second input voltages.

14. A multiplier comprising:

a first differential pair of first and second MOS transistors whose capacities are the same and whose drains are coupled together;

a second differential pair of third and fourth MOS transistors whose capacities are the same and whose drains are coupled together;

a third differential pair of fifth and sixth MOS transistors whose capacities are the same and whose drains are coupled together;

a fourth differential pair of seventh and eighth MOS transistors whose capacities are the same and whose drains are coupled together;

a constant current source for driving said first, second, third and fourth differential pairs, sources of said first to eighth transistors being connected in common to said constant current source;

a half of a sum of first and second input voltages being applied in positive phase across a gate of said first transistor of said first pair and a reference point;

said half of a sum of said first and second input voltages being applied in negative phase across a gate of said second transistor of said first pair and said reference point;

a half of a difference of said first and second input voltages being applied in positive phase across a gate of said third transistor of said second pair and said reference point;

said half of a difference of said first and second input voltages being applied in negative phase across a gate of said fourth transistor of said second pair and said reference point;

gates of said fifth and sixth transistors of said third pair and gates of said seventh and eighth transistors of said fourth pair being coupled together to be applied with a dc reference voltage;

said coupled drains of said first and second transistors of said first pair forming one of a pair of differential output ends and said coupled drains of said third and fourth transistors of said second pair forming the other of said pair of differential output ends; and said coupled drains of said fifth and sixth transistors of said third pair and said coupled drains of said seventh and eighth transistors of said fourth pair being separated from said pair of differential output ends, respectively;

wherein an output, or a multiplication result of said first and second input voltages, of said multiplier is derived from said pair of differential output ends.

15. A multiplier as claimed in claim 14, wherein said dc reference voltage is a middle level of said sum and difference of said first and second input voltages.

16. A multiplier as claimed in claim 14, wherein said coupled drains of said fifth and sixth transistors of said third pair and said coupled drains of said seventh and eighth transistors of said fourth pair are coupled together.

17. A multiplier comprising:

a first pair of first and second bipolar transistors whose capacities are the same and whose collectors are coupled together;

a second pair of third and fourth bipolar transistors whose capacities are the same and whose collectors are coupled together;

a constant current source for driving said first and second pairs, emitters of said first to fourth transistors being connected in common to said constant current source;

a half of a sum of first and second input voltages being applied in positive phase across a base of said first transistor of said first pair and a reference point;

said half of a sum of said first and second input voltages being applied in negative phase across a base of said second transistor of said first pair and said reference point;

a half of a difference of said first and second input voltages being applied in positive phase across a base of said third transistor of said second pair and said reference point;

said half of a difference of said first and second input voltages being applied in negative phase across a base of said fourth transistor of said second pair and said reference voltage;

said reference point being applied with a dc reference voltage;

said coupled collectors of said first and second transistors of said first pair forming one of a pair of differential output ends; and said coupled output ends of said third and fourth transistors of said second pair forming the other of said pair of differential output ends;

wherein an output, or a multiplication result of said first and second input voltages, of said multiplier is derived from said pair of differential output ends.

18. A multiplier as claimed in claim 17, wherein said dc reference voltage is a middle level of said sum and difference of said first and second input voltages.

* * * * *